US009820410B2

(12) United States Patent
Kanasaki et al.

(10) Patent No.: US 9,820,410 B2
(45) Date of Patent: Nov. 14, 2017

(54) ELECTRONIC DEVICE AND METHOD FOR MOUNTING UNIT

(71) Applicant: FUJITSU LIMITED, Kawasaki-shi, Kanagawa (JP)

(72) Inventors: Katsumi Kanasaki, Machida (JP); Kenji Joko, Yokohama (JP); Osamu Saito, Kawasaki (JP); Hideaki Matsumoto, Yokohama (JP); Minoru Fujii, Kawasaki (JP); Takaharu Izuno, Kawasaki (JP); Mitsuaki Hayashi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 61 days.

(21) Appl. No.: 15/000,355

(22) Filed: Jan. 19, 2016

(65) Prior Publication Data
US 2016/0249479 A1    Aug. 25, 2016

(30) Foreign Application Priority Data

Feb. 19, 2015   (JP) .................................. 2015-030956

(51) Int. Cl.
*H05K 7/20*     (2006.01)

(52) U.S. Cl.
CPC .............................. *H05K 7/20736* (2013.01)

(58) Field of Classification Search
CPC ... H05K 7/20554–7/20563; G06F 1/20; G06F 1/203
USPC ................ 361/695, 679.49–679.51; 454/184
See application file for complete search history.

(56) References Cited

U.S. PATENT DOCUMENTS

| 7,113,401 | B2* | 9/2006 | Becker | G06F 1/183 165/122 |
| 7,280,356 | B2* | 10/2007 | Pfahnl | H05K 7/20563 361/690 |
| 8,331,086 | B1* | 12/2012 | Meissner | H05K 7/20127 312/223.2 |
| 8,405,985 | B1* | 3/2013 | Reynov | H05K 7/20736 361/688 |
| 8,542,485 | B2* | 9/2013 | Nemoz | H05K 7/20672 361/690 |
| 8,564,951 | B1* | 10/2013 | Watanabe | H05K 7/20736 165/104.33 |
| 8,737,067 | B1* | 5/2014 | Kim | H05K 7/1492 342/175 |

(Continued)

FOREIGN PATENT DOCUMENTS

JP           2006-59448      3/2006
JP     WO 2006/054332 A1    5/2006

*Primary Examiner* — David M Sinclair
*Assistant Examiner* — Robert Brown
(74) *Attorney, Agent, or Firm* — Staas & Halsey LLP

(57) ABSTRACT

An electronic device includes: a frame in which a unit is mounted on each of an upper row and a lower row of the frame; a rack configured to accommodate a plurality of frames; a back plate configured to close the rack on a rear side of the frame; and a duct configured to protrude from an insertion hole formed in the back plate, and form an opening with a hole edge of the insertion hole so as to discharge air passing through the unit on the lower row, the duct separating the unit on the upper row and the unit on the lower row from each other, wherein a cross-sectional area of the opening is adjusted by adjustment of a protrusion length from the insertion hole.

19 Claims, 30 Drawing Sheets

(56) References Cited

U.S. PATENT DOCUMENTS

| | | | | |
|---|---|---|---|---|
| 9,320,175 B2* | 4/2016 | Peng | | H05K 7/20727 |
| 2005/0105879 A1* | 5/2005 | Kanasaki | | G02B 6/4453 |
| | | | | 385/147 |
| 2005/0153649 A1* | 7/2005 | Bettridge | | H05K 7/20736 |
| | | | | 454/188 |
| 2005/0207134 A1* | 9/2005 | Belady | | H05K 1/14 |
| | | | | 361/796 |
| 2006/0039108 A1* | 2/2006 | Chikusa | | G06F 1/20 |
| | | | | 361/695 |
| 2007/0258211 A1* | 11/2007 | Sonobe | | H05K 7/20572 |
| | | | | 361/695 |
| 2009/0122484 A1* | 5/2009 | Caveney | | H05K 7/20736 |
| | | | | 361/692 |
| 2010/0118489 A1* | 5/2010 | Izuhara | | H05K 9/0062 |
| | | | | 361/694 |
| 2011/0249386 A1* | 10/2011 | Lin | | H05K 7/20736 |
| | | | | 361/679.5 |
| 2011/0266229 A1* | 11/2011 | Elwany | | H05K 7/20736 |
| | | | | 211/26 |
| 2012/0201003 A1* | 8/2012 | Shimasaki | | H05K 7/20736 |
| | | | | 361/695 |
| 2013/0083481 A1* | 4/2013 | Goto | | H05K 7/20209 |
| | | | | 361/695 |
| 2013/0109288 A1* | 5/2013 | Tang | | H05K 7/20736 |
| | | | | 454/184 |
| 2013/0160984 A1* | 6/2013 | Cash | | G06F 1/20 |
| | | | | 165/200 |
| 2014/0040524 A1* | 2/2014 | Luck | | G06F 1/181 |
| | | | | 710/306 |
| 2014/0085808 A1* | 3/2014 | Tung | | H05K 7/20736 |
| | | | | 361/679.47 |
| 2014/0168891 A1* | 6/2014 | Mundt | | G06F 1/188 |
| | | | | 361/679.58 |
| 2014/0268568 A1* | 9/2014 | Joko | | H05K 7/20145 |
| | | | | 361/695 |
| 2015/0011150 A1* | 1/2015 | Kawamoto | | H05K 7/20572 |
| | | | | 454/184 |
| 2015/0108630 A1* | 4/2015 | Izuno | | H01L 21/50 |
| | | | | 257/713 |
| 2015/0139223 A1* | 5/2015 | Mayenburg | | H05K 5/0213 |
| | | | | 370/357 |
| 2015/0296664 A1* | 10/2015 | Peng | | H05K 7/20736 |
| | | | | 361/679.46 |
| 2016/0143180 A1* | 5/2016 | Zhu | | H05K 7/20572 |
| | | | | 454/184 |

* cited by examiner

ELECTRONIC DEVICE AND METHOD FOR MOUNTING UNIT

CROSS-REFERENCE TO RELATED APPLICATION

This application is based upon and claims the benefit of priority of the prior Japanese Patent Application No. 2015-030956, filed on Feb. 19, 2015, the entire contents of which are incorporated herein by reference.

FIELD

The embodiments discussed herein are related to an electronic device and a method for mounting a unit.

BACKGROUND

There is a rack structure having a heat shielding plate disposed between upper and lower shelves in which air increased of its temperature due to being used to cool the lower shelf is discharged along a partition plate of the heat shielding plate such that the heated air does not affect the upper shelf.

Furthermore, there is a disk array device having a mechanism in which an opening area of a vent hole of a back board is adjusted in such a manner that when a unit on which a hard disk drive is mounted is mounted, the vent hole is opened and when a unit on which a hard disk drive is mounted is not mounted, the vent hole is closed.

International Publication Pamphlet No. WO 2006/054332 and Japanese Laid-open Patent Publication No. 2006-059448 are reference documents.

SUMMARY

According to an aspect of the invention, an electronic device includes: a frame in which a unit is mounted on each of an upper row and a lower row of the frame; a rack configured to accommodate a plurality of frames; a back plate configured to close the rack on a rear side of the frame; and a duct configured to protrude from an insertion hole formed in the back plate, and form an opening with a hole edge of the insertion hole so as to discharge air passing through the unit on the lower row, the duct separating the unit on the upper row and the unit on the lower row from each other, wherein a cross-sectional area of the opening is adjusted by adjustment of a protrusion length from the insertion hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a structure in which frames, each frame having two units mounted in a separated manner with respect to each other in the upper row and the lower row, are mounted and in which air that has cooled the units on the lower row is made to flow from the vent hole in the backboard to the rear side, there are cases in which there is a frame having no lower unit mounted thereon. In such a state, in the frame having no lower unit mounted thereon, since there is no unit, the ventilation resistance becomes low and cooling air flows into the frame having no unit mounted thereon, and, consequently, the cooling air tends to not flow in the frame having the unit mounted thereon.

Hereinafter, with reference to the drawings, embodiments of a technique that, regardless of whether there is a frame having no unit mounted thereon, suppresses decrease in the flow rate of cooling air to the frame having a unit mounted thereon will be described.

First Embodiment

Figure 1:
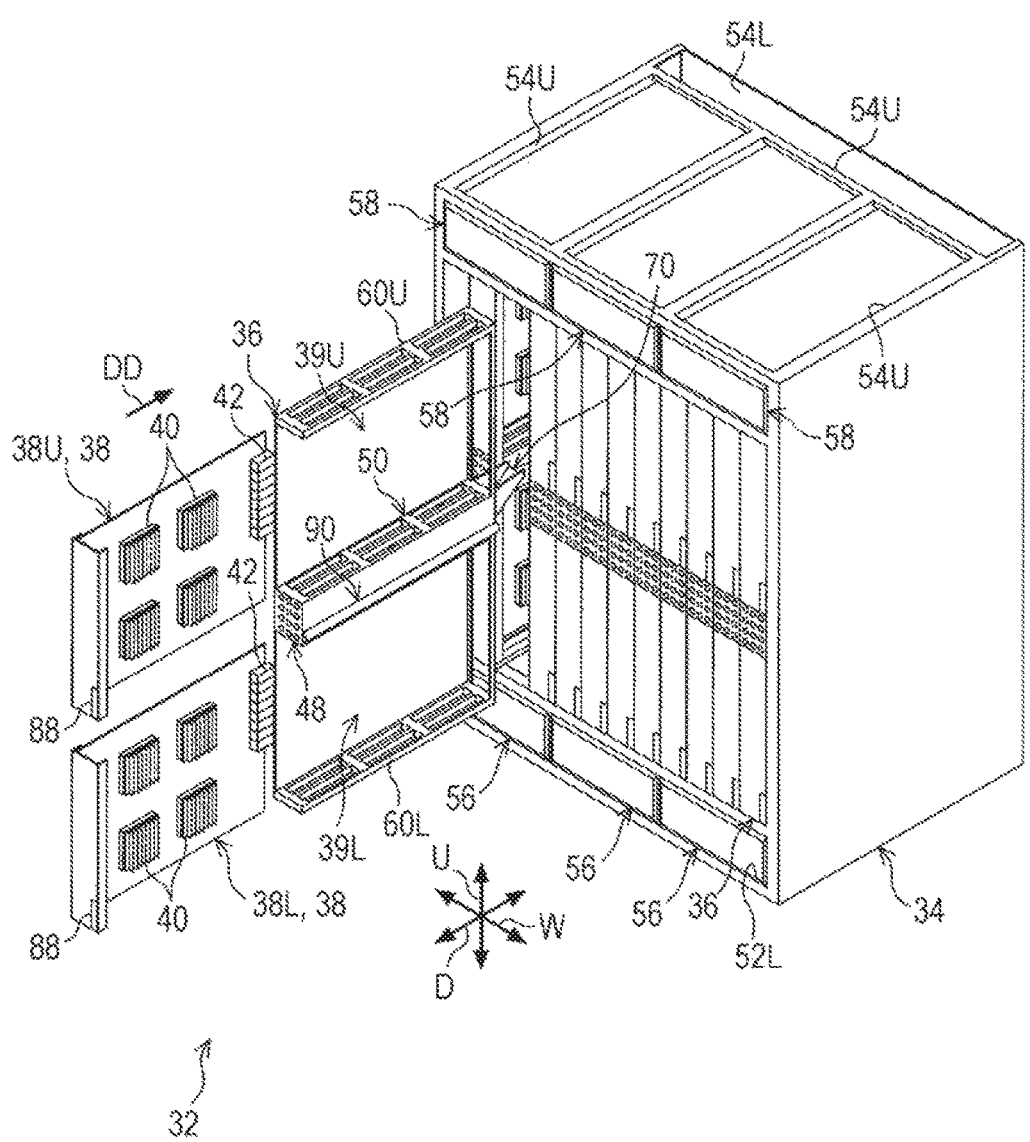
FIG. 1 is an exploded perspective view illustrating an electronic device of a first embodiment.
Figure 2:
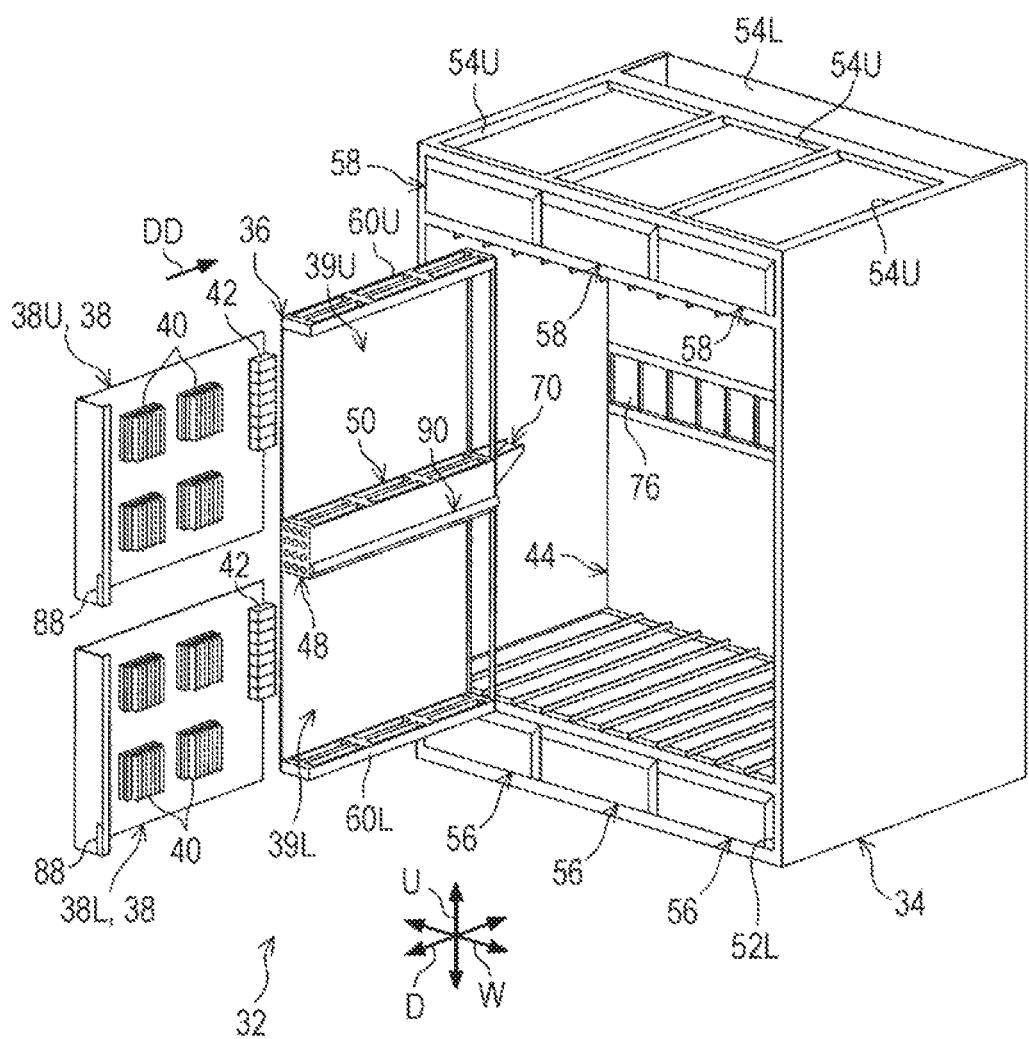
FIG. 2 is an exploded perspective view illustrating the electronic device of the first embodiment being partially not shown.

Description of a first embodiment will be given. As illustrated in FIGS. 1 and 2, an electronic device 32 of the first embodiment includes a shelf 34. In the present embodiment, the shelf 34 is a rectangular parallelepiped box shaped member. A surface on the front side of the shelf 34 is open, and the shelf 34 is capable of accommodating a plurality of frames 36 therein in an aligned manner. Furthermore, a back plate, for example, a connection substrate 44 described later, covers and closes a portion inside the shelf 34 on the rear side. The shelf 34 is an example of a rack.

Hereinafter, the width direction, the depth direction, and the up-down direction of the shelf 34 will be indicated by arrows W, D, and U, respectively. The width direction of the shelf 34 coincides with the direction in which the plurality of frames 36 are aligned inside the shelf 34.

Each frame 36 of the present embodiment is capable of mounting two units 38 aligned vertically with respect to each other. The frames 36 each include a member, for example, a slide rail, for supporting the unit 38 while allowing the unit 38 to slide in the depth direction. The unit 38 may be referred to as a plug-in unit (PIU). The direction of insertion when mounting the unit 38 into the frame 36 is indicated by an arrow DD. The side to which the arrow DD points is the depth side of the shelf 34, the frames 36, and the units 38.

Hereinafter, when two upper and lower units 38 are to be distinguished with each other, the two upper and lower units 38 will be referred to as an upper unit 38U and a lower unit 38L. Furthermore, in each frame 36, the portion on which the upper unit 38U is mounted is referred to as an upper mount portion 39U and the portion in which the lower unit 38L is mounted is referred to as a lower mount portion 39L.

Electronic components 40 are mounted on the units 38. Each electronic component 40 is electrically connected to a corresponding one of connection terminals 45 of the connection substrate 44 described later through a wire and a connection terminal 42 of the corresponding unit 38. The connection substrate 44 may be referred to as a back wiring board (BWB).

Each frame 36 includes a duct 48 provided at an intermediate portion of a corresponding one of frame bodies 46 in the up-down direction.

Figure 3:
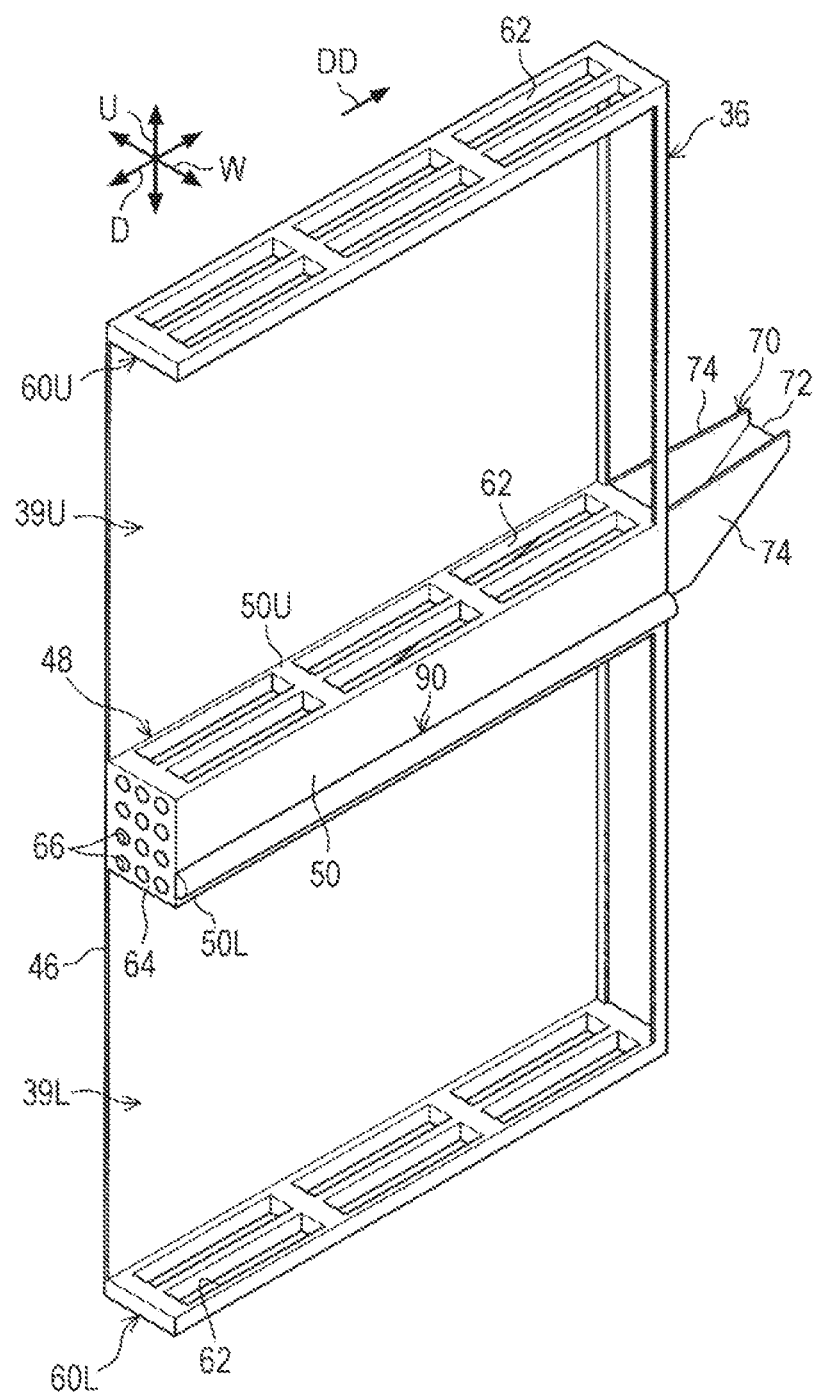
FIG. 3 is a perspective view illustrating a frame of the electronic device of the first embodiment.
Figure 4:
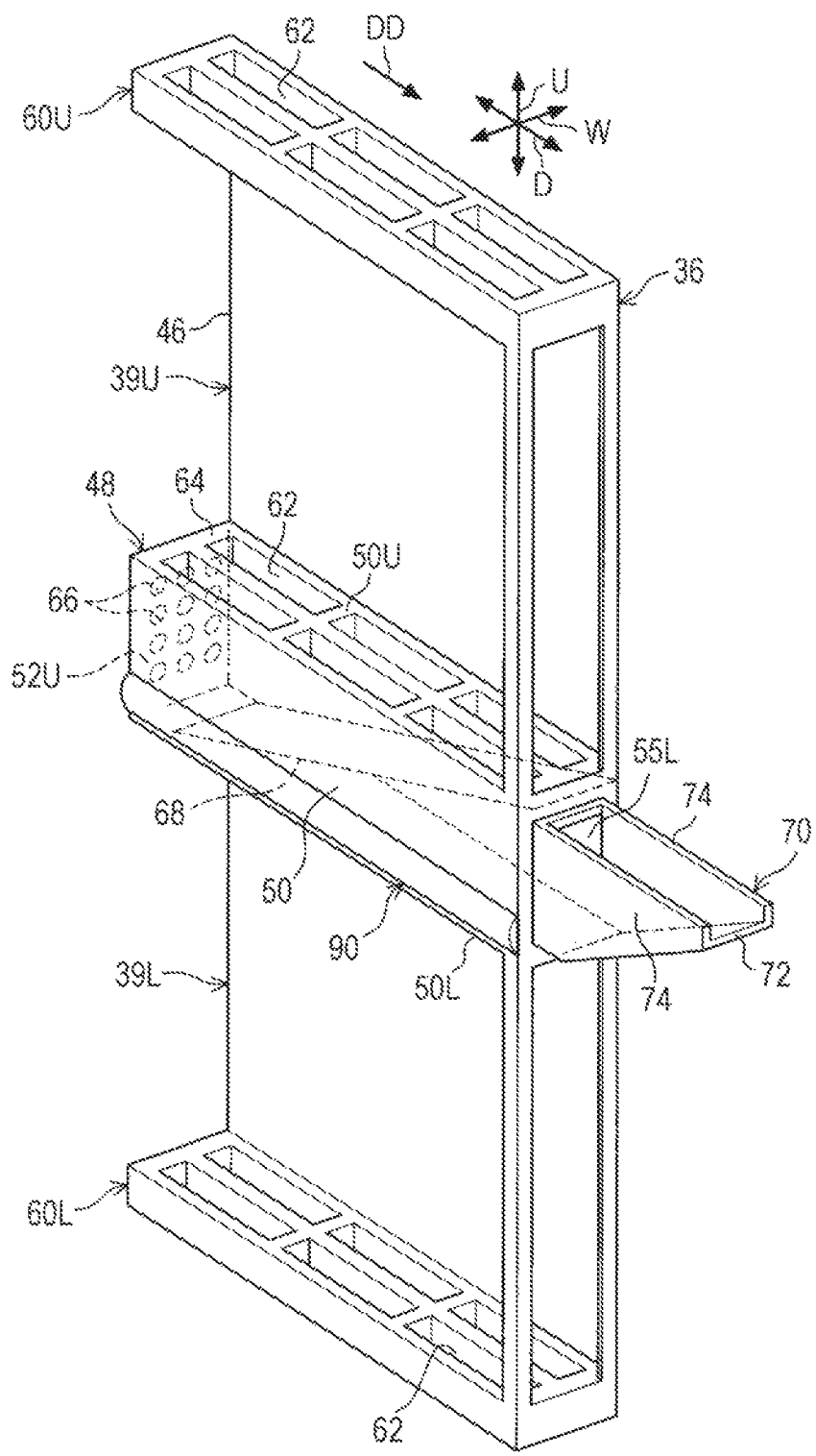
FIG. 4 is a perspective view illustrating the frame of the electronic device of the first embodiment.

As illustrated in FIGS. 3 and 4, each duct 48 includes a rectangular tube shaped tubular body 50 that extends from the front end side to the rear and side of the corresponding frame 36 in the depth direction (the arrow DD direction).

As illustrated in FIG. 4, the portion in the front side of the tubular body 50 includes intake ports 52U for drawing in air that is passed through the upper mount portion 39U (the upper unit 38U), and the portion in the depth side of the tubular body 50 includes a discharge port 55L for discharging air that has passed through the lower mount portion (the lower unit 38L).

As illustrated in FIGS. 1 and 2, suction fans 56 are provided in the lower portion of the shelf 34. In the shelf 34, intake ports 52L are formed on the lower sides or the front sides of the suction fans 56. As illustrated by an arrow F6 in FIGS. 10 and 11, the electronic device 32 draws in air from the intake ports 52L with the drive of the suction fans 56.

Discharge fans 58 are provided in the upper portion of the shelf 34. As illustrated by an arrow F3 in FIGS. 10 and 11, the electronic device 32 is capable of drawing in air from the intake ports 52U with the drive of the discharge fans 58.

Discharge ports 54U are formed in the upper portion of the shelf 34. As illustrated by an arrow F5 in FIGS. 10 and 11, the electronic device 32 discharges air inside the shelf 34 from the discharge ports 54U with the drive of the discharge fans 58.

A discharge port 54L is formed in the upper portion of the shelf 34 and on the depth side of the discharge ports 54U. As illustrated by an arrow F10 in FIGS. 10 and 11, with the drive of the suction fans 56, the electronic device 32 is capable of passing the air, which has been discharged from the discharge ports 55L of the tubular bodies 50, through the depth side of the connection substrate 44 and discharging the air from the discharge port 54L.

As illustrated in FIGS. 3 and 4, each frame 36 includes the frame body 46 having a plate shape. Each frame 36 includes an upper frame plate 60U and a lower frame plate 60L that are provided on the upper portion and the lower portion, respectively, of the corresponding frame body 46. Vent holes 62 are formed in each upper frame plate 60U and in each lower frame plate 60L.

A ventilation plate 64 is fixed to the front side of each tubular body 50. Each ventilation plate 64 is a conductive plate-shaped member formed of metal or the like and a plurality of vent holes 66 are formed therein. When the discharge fans 58 are driven, the air (the arrow F3 in FIGS. 10 and 11) that is drawn in from the intake ports 52U passes through the vent holes 66 from the front side of the shelf 34 and enters the inside of the tubular bodies 50.

Since the ventilation plates 64 are conductive, the ventilation plates 64 exhibit a function of suppressing leakage of electromagnetic waves from the units 38. A metal plate with holes that is called a punching metal may be used as the ventilation plate 64. The ventilation plate 64 is an example of a ventilation member. Other than the punching metal, the ventilation member may be a metal net-shaped member, for example.

Vent holes 62 are formed in an upper wall 50U and a lower wall 50L of each tubular body 50. Air that has been drawn in from the intake ports 52U passes through the vent holes 62 of the upper walls 50U and reaches the upper mount portions 39U. Air that has ascended through the lower mount portions 39L passes through the vent holes 62 of the lower walls 50L and flows into the tubular bodies 50.

A separator 68 that is inclined obliquely upwards from the front side towards the depth side is disposed inside each tubular body 50. Each upper mount portion 39U and the corresponding lower mount portion 39L are separated from each other by the corresponding tubular body 50, particularly, by the corresponding separator 68. The tubular body 50 (the separator 68) is an example of a separation member.

A slide member 70 is provided on the depth side of each separator 68. Each slide member 70 includes an inclined wall 72 that is inclined obliquely upwards from the front side towards the depth side. Furthermore, each slide member 70 includes a pair of vertical walls 74 that are provided so as to stand upwards from both sides of the corresponding inclined wall 72.

Figure 5:
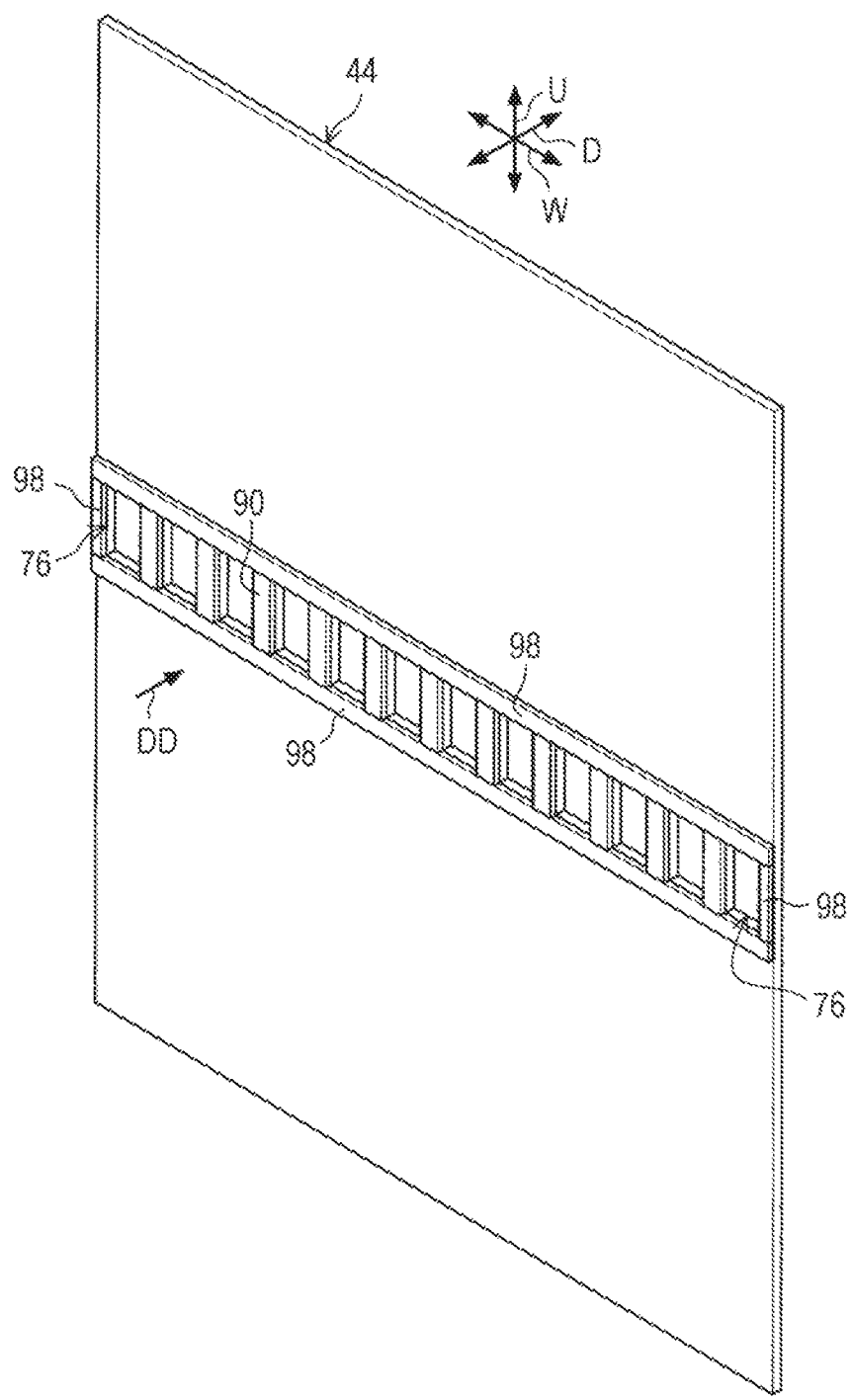
FIG. 5 is a perspective view illustrating a connection substrate of the electronic device of the first embodiment.
Figure 6:
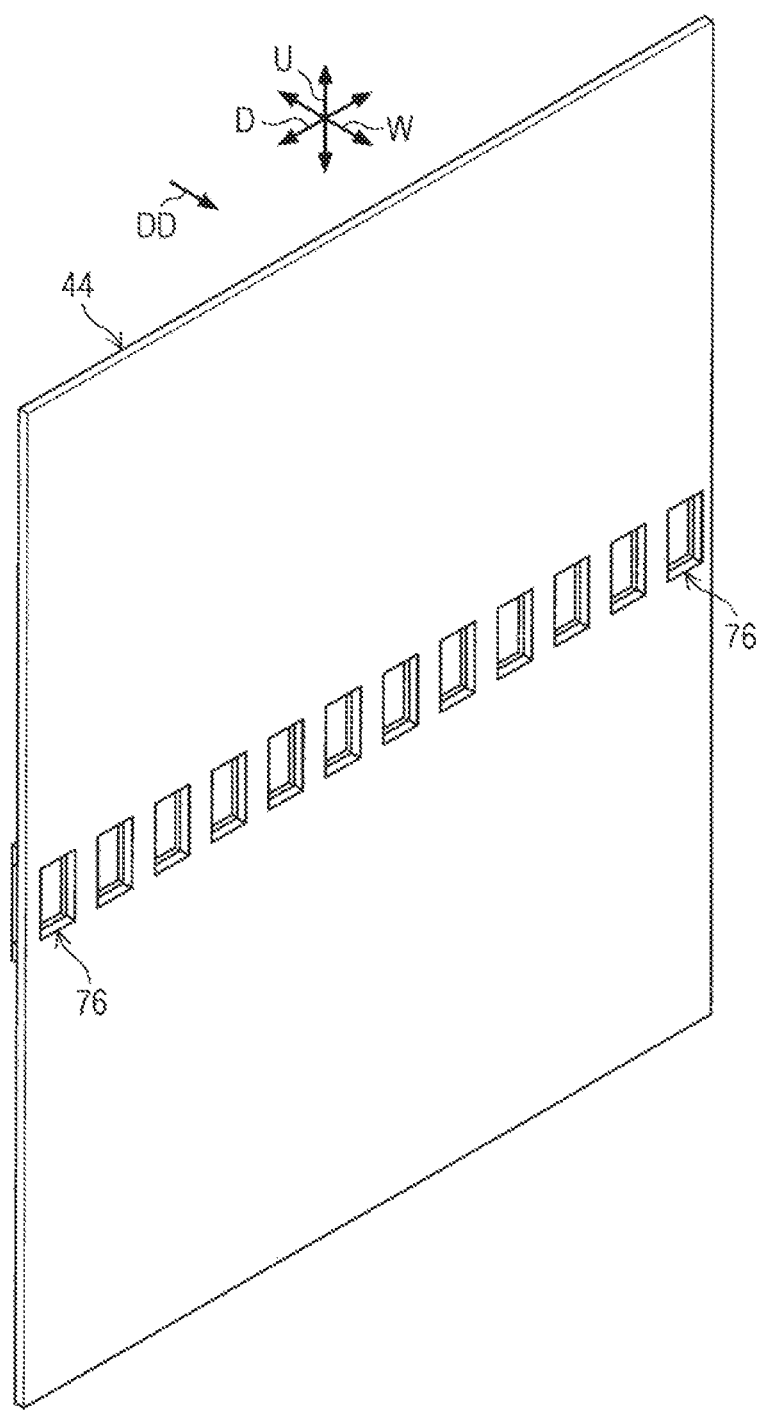
FIG. 6 is a perspective view illustrating the connection substrate of the electronic device of the first embodiment.
Figure 7:
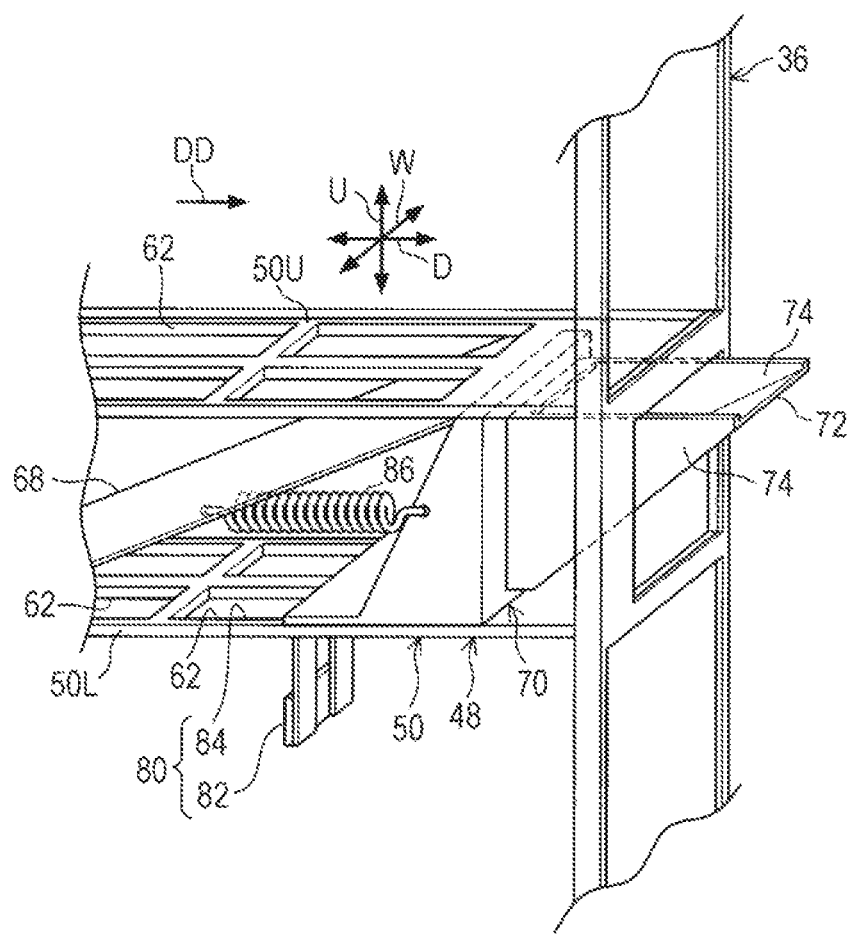
FIG. 7 is a perspective view illustrating a vicinity of a slide member of the electronic device of the first embodiment.
Figure 8:
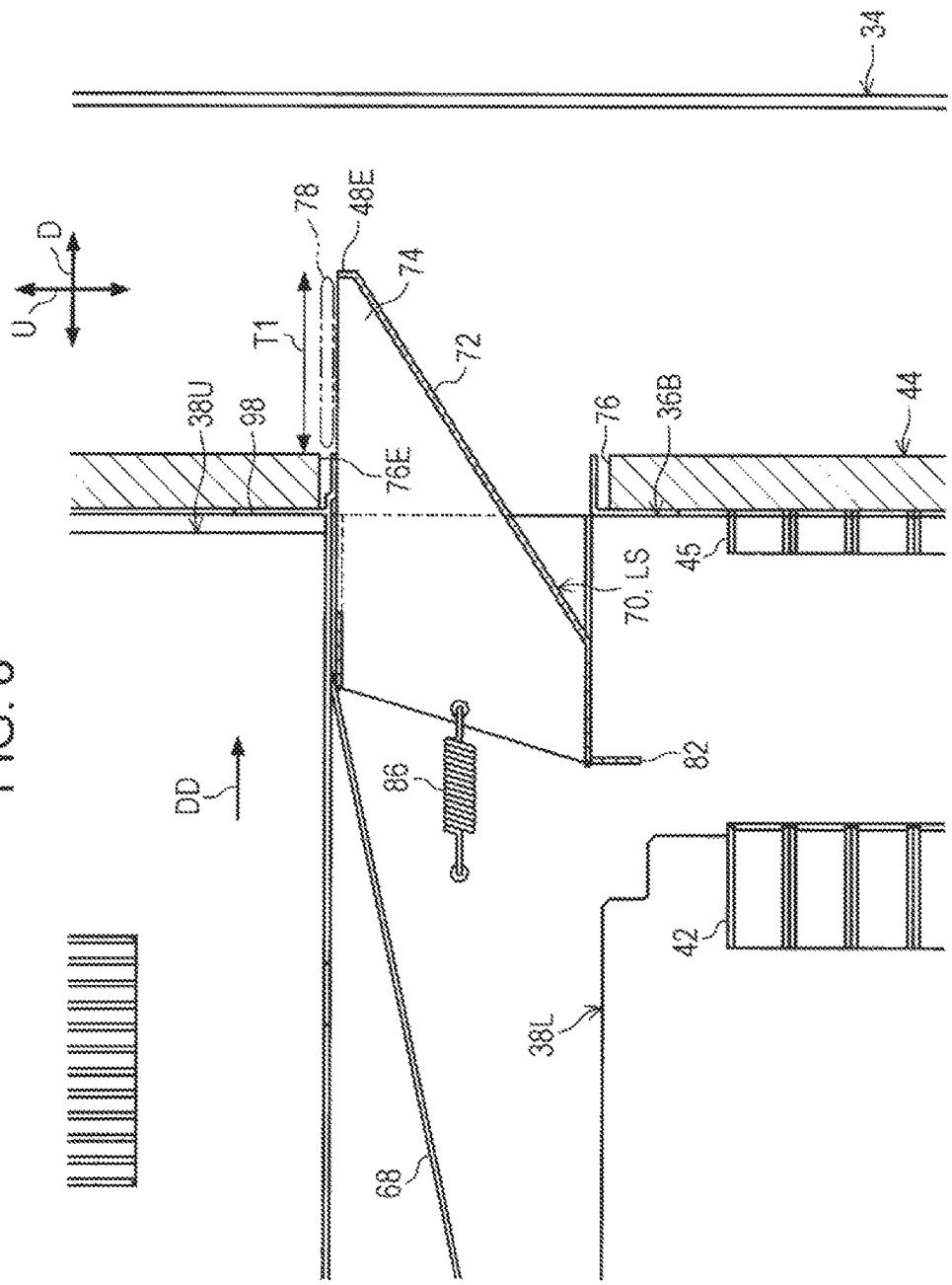
FIG. 8 is a cross-sectional view illustrating a vicinity of the slide member of the electronic device of the first embodiment.
Figure 9:
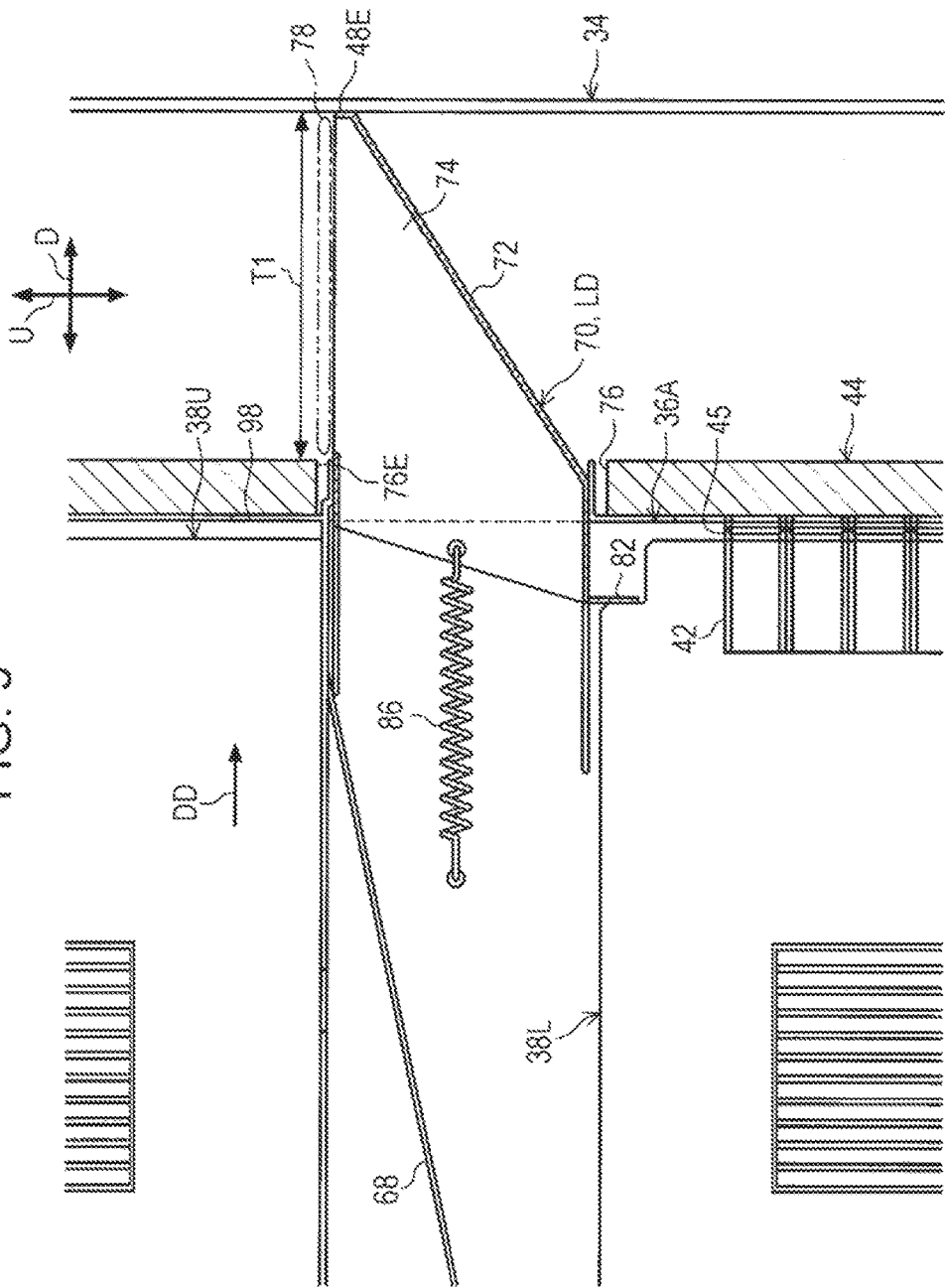
FIG. 9 is a cross-sectional view illustrating a vicinity of the slide member of the electronic device of the first embodiment.

As illustrated in FIGS. 5 and 6, a plurality of insertion holes 76 that correspond to the frames 36 in a one-to-one manner are formed in the connection substrate 44. Furthermore, as illustrated in FIGS. 7 to 9, a portion on the depth side of each slide member 70 is inserted into the corresponding insertion hole 76. In other words, a portion (a portion on the depth side) of each duct 48 is inserted into the corresponding insertion hole 76 that is formed in the connection substrate 44 so as to protrude from the depth side of the connection substrate 44.

As illustrated in FIG. 8, the plurality of connection terminals 45 that are connected with the connection terminals 42 of the units 38 are provided on the connection substrate 44. The connection substrate 44 is an example of the back plate. The back plate may be a plate that is not electrically connected to the units 38 but that covers and closes the rear side of the frames 36.

As illustrated in FIGS. 7 to 11, an opening 78 is formed between a hole edge 76E of each insertion hole 76 and a depth-side end portion 48E of the corresponding duct 48 (inclined wall 72). With the drive of the suction fans 56, air that has ascended through the lower mount portions 39L of the frames 36 is, as indicated by an arrow F8, guided obliquely upwards towards the depth side with the separator 68. As indicated by an arrow F9, the air flows obliquely upwards along the inclined walls 72, passes through the openings 78, and flows towards the depth side of the connection substrate 44.

Each slide member 70 slides towards the depth direction (the arrow DD direction) with respect to the corresponding tubular body 50 (the separator 68). The slide member 70 being slid changes a protrusion length T1 of the slide member 70 from the insertion hole 76 such that the opening area of the opening 78 changes as well.

As illustrated in FIG. 9, at a position where the slide member 70 is slid to the depth side, the opening area of the opening 78 is increased. The above position of the slide member 70 is referred to as an increased position LD. On the other hand, as illustrated in FIG. 8, at a position where the slide member 70 is slid to the front side, the opening area of the opening 78 is decreased. The above position of the slide member 70 is referred to as a decreased position LS.

The sliding of each slide member 70 is guided by a guide member 80 that includes push plates 82 and long holes 84.

As illustrated in FIG. 7, a single or a plurality of (two arranged in the width direction in the example illustrated in FIG. 7) push plates 82 are formed in the edge portion on the front side of each slide member 70. The push plate 82 is formed at a position in which the push plate 82 is pushed against a portion of the lower unit 38L in the course of inserting the lower unit 38L into the lower mount portion 39L when the lower unit 38L is mounted in the lower mount portion 39L.

The long holes 84 are formed in the lower wall 50L of the corresponding tubular body 50 such that the longitudinal direction thereof is the depth direction. Each push plate 82 is inserted into the corresponding long hole 84 from above. The present embodiment may adopt a structure in which portions of the vent holes 62 serve as the long holes 84.

The sliding range of each slide member 70 is set to a predetermined range. Hereinafter, the position of each slide member 70 at the deepest position on the depth side is referred to as the increased position LD (see FIG. 9) and the position of each slide member 70 that is nearest to the front side is referred to as the decreased position LS (see FIG. 8).

One end of a tension coil spring 86 is fixed to the tubular body 50 (a portion of the frame 36). The other end of the tension coil spring 86 is fixed to the slide member 70. Tensile force of the tension coil spring 86 acts on the slide member 70 in a direction (towards the front side) in which the protrusion length T1 from the connection substrate 44 becomes shorter.

The sliding range of each slide member 70 is determined in the following manner according to the relationship with the cross-sectional area of the opening 78.

Figure 10:
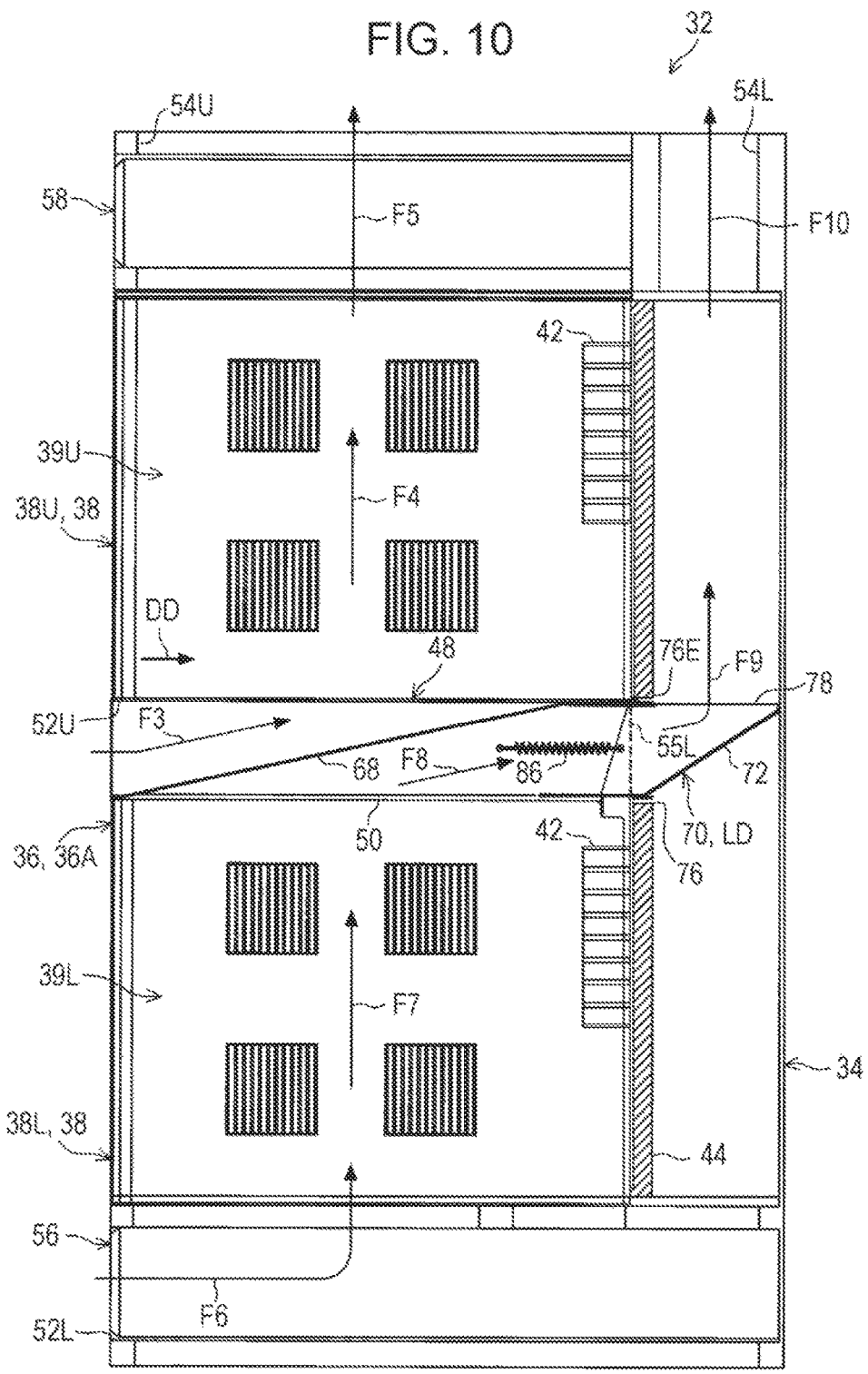
FIG. 10 is a cross-sectional view illustrating the electronic device of the first embodiment.
Figure 11:
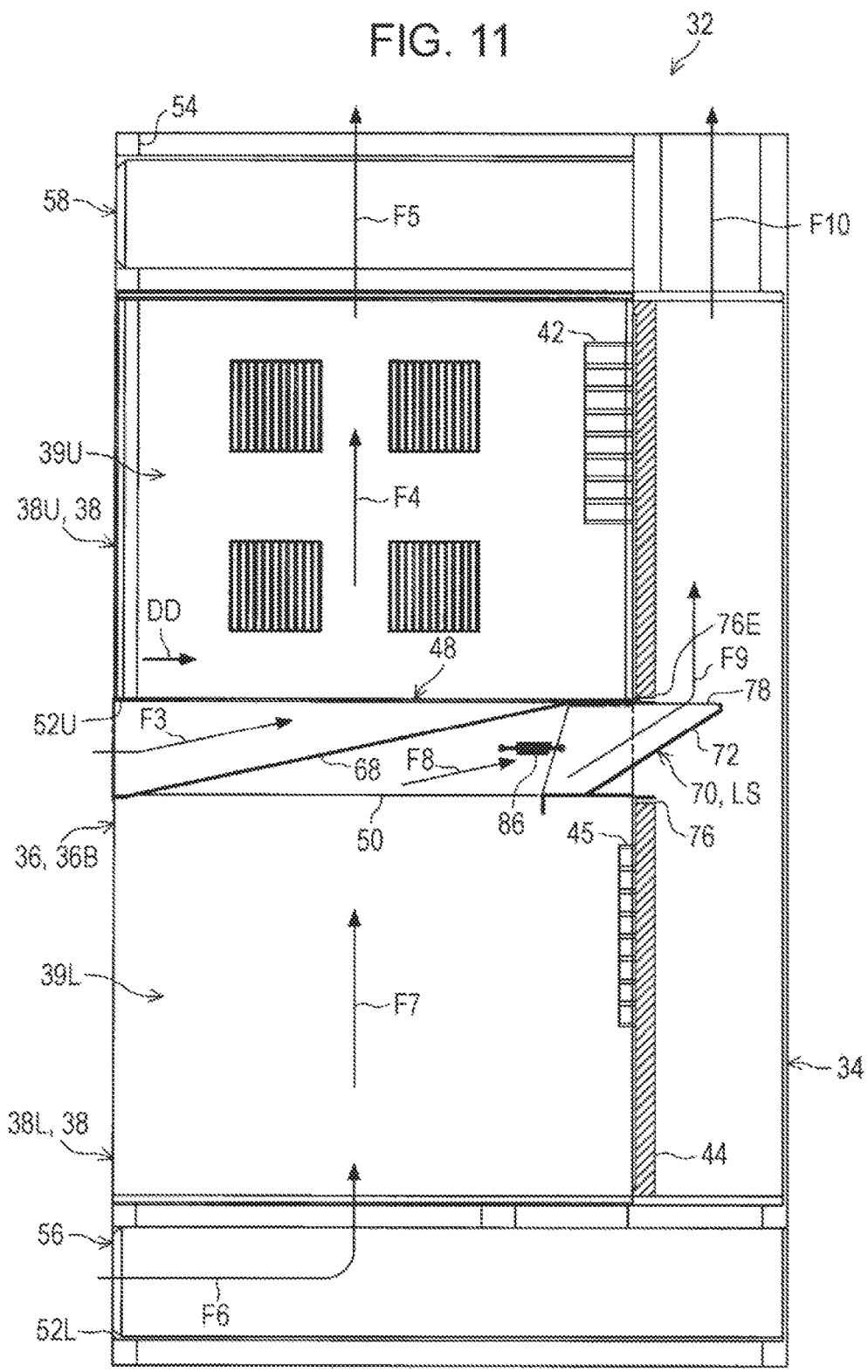
FIG. 11 is a cross-sectional view illustrating the electronic device of the first embodiment.
Figure 12:
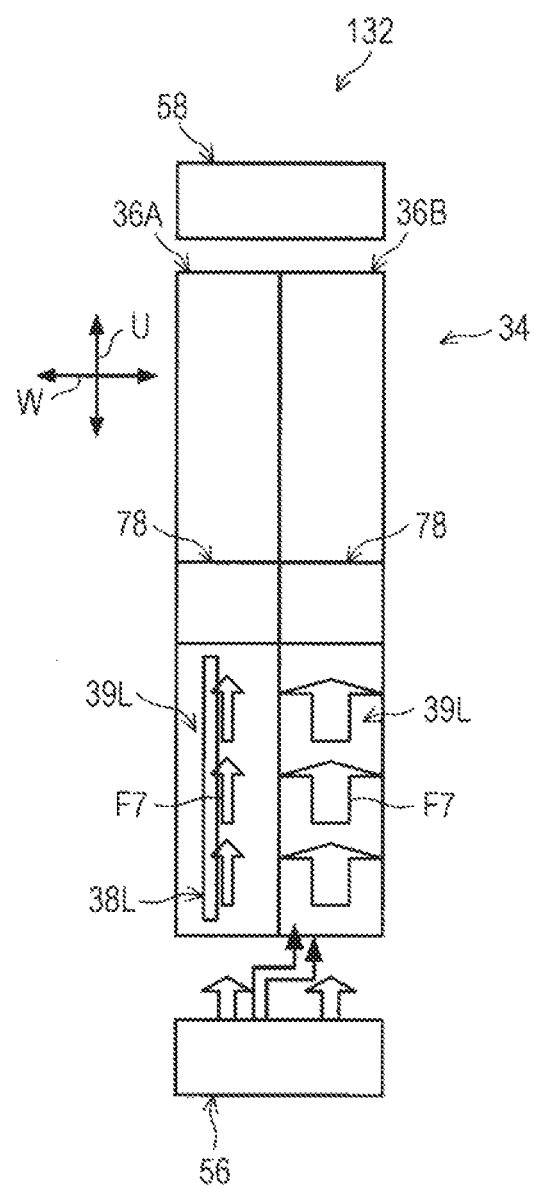
FIG. 12 is a front view partially illustrating an electronic device of a comparative example.
Figure 13:
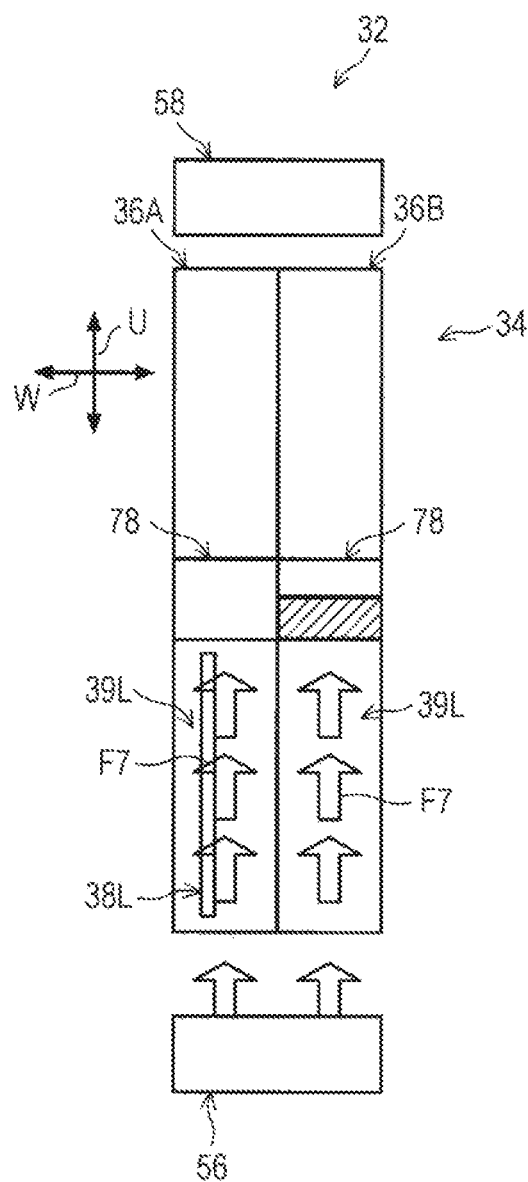
FIG. 13 is a front view partially illustrating the electronic device of the first embodiment.

There are cases in which, in the frames 36, as illustrated in FIG. 10, there are frames 36 in which the lower units 38L are mounted and, other than that, as illustrated in FIG. 11, there are frames 36 in which the lower units 38L are not mounted. Hereinafter, the frame 36 in which the lower unit 38L is mounted is referred to as a lower mounted frame 36A, and the frame 36 in which the lower unit 38L is not mounted is referred to as a lower non-mounted frame 36B so as to make a distinction therebetween. FIGS. 12 and 13 each illustrate, as an example, a state in which two adjacent frames 36 are viewed from the front side. FIG. 12 illustrates an electronic device 132 of a comparative example described later, and FIG. 13 illustrates the electronic device 32 of the present embodiment.

As illustrated by an arrow F7 in FIGS. 10 to 13, air flows through the lower mount portions 39L with the drive of the suction fans 56. The ventilation resistance acting on the air is smaller in the lower non-mounted frame 36B that is mounted with no lower unit 38L than in the lower mounted frame 36A that is mounted with the lower unit 38L.

FIG. 12 illustrates the electronic device 132 of the comparative example. In the electronic device 132 of the comparative example, the lower mounted frame 36A and the lower non-mounted frame 36B are disposed adjacent to each other. Furthermore, the opening areas of the openings 78 (practically, the insertion holes 76 of the connection substrate 44) of the ducts 48 in the lower mounted frame 36A and the lower non-mounted frame 36B are the same. In the electronic device 132 of the comparative example, since the ventilation resistance in the lower mount portion 39L of the lower non-mounted frame 36B (the frame 36 on the right side) is smaller, air flows therethrough more easily. As a result, the amount of air flowing through the lower mount portion 39L of the lower mounted frame 36A (the frame 36 in the left side) becomes small.

In consideration of the above, in the electronic device 32 of the present embodiment, the cross-sectional area of the opening 78 in the lower non-mounted frame 36B is made smaller and the ventilation resistance is made larger so that the ventilation resistance may be made closer to that of the ventilation resistance of the opening 78 in the lower mounted frame 36A. Since air does not easily flow to the opening 78 in the lower non-mounted frame 36B, consequently, the amount of air passing through the lower mount portion 39L of the lower mounted frame 36A may be made large. For example, as illustrated in FIG. 13, the amount of air flowing through the lower mount portion 39L of the lower non-mounted frame 36B may be made close to the amount of air flowing through the lower mount portion 39L of the lower mounted frame 36A. The sliding range of the slide member 70 is determined so that the cross-sectional area of the opening 78 is set to a desired cross-sectional area from the viewpoint described above.

As illustrated in FIG. 8, in a state in which the lower unit 38L is not mounted in the lower mount portion 39L (including a state in which the lower unit 38L is in the course of being mounted), the slide member 70 receiving the tensile force of the tension coil spring 86 is in the decreased position LS.

In a state in which the slide member 70 is in the decreased position LS, when the lower unit 38L is inserted into the lower mount portion 39L, a portion of the lower unit 38L abuts against the push plates 82. In the above state, when the lower unit 38L is moved further towards the depth side, since the push plates 82 are pushed by the lower unit 38L, the slide member 70 countering the tensile force of the tension coil spring 86 slides towards the depth side.

As illustrated in FIG. 1, each unit 38 is provided with a lock lever 88. The lock lever 88 is an example of a lock member. In a state in which the unit 38 is inserted into the shelf 34 to a predetermined mount position, the lock lever 88 is operated so as to be capable of locking and restricting movement of the unit 38 at the mount position. The lower unit 38L being locked at the mount position locks the slide member 70 at the increased position LD as well.

Figure 14:
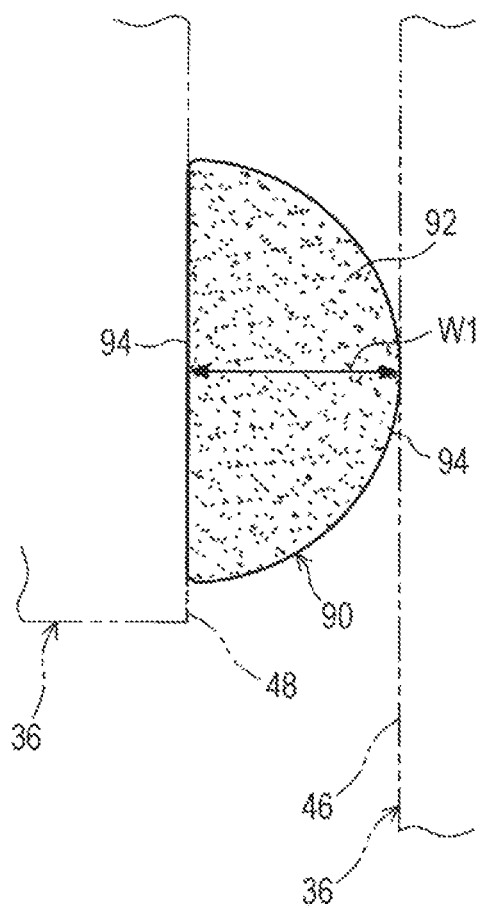
FIG. 14 is a cross-sectional view illustrating a gasket of the electronic device of the first embodiment.

As illustrated in FIGS. 3 and 4, a gasket 90 is provided on the side wall 50S of each tubular body 50. As illustrated in FIG. 14 as well, each gasket 90 includes a core material 92 and a coating material 94 that surrounds the core material 92. The core material 92 is formed of an elastic material (a sponge, for example). Each coating material 94 is formed of a conductive material (metal, for example). In other words, the gasket 90 is a member that has both elasticity and conductivity.

In an accommodated state in the shelf 34, the width W1 of the gasket 90 is determined so that the gasket 90 is in contact with the frame body 46 of the adjacent frame 36. Since the gasket 90 has elasticity, the gasket 90 is compressed in the width direction and adheres to the adjacent frame body 46. With the above, flow of air between the upper mount portion 39U and the lower mount portion 39L is suppressed.

Furthermore, since the gasket 90 has conductivity, leakage of electromagnetic waves from the lower unit 38L to the upper mount portion 39U and leakage of electromagnetic waves from the upper unit 38U to the lower mount portion 39L are suppressed.

Figure 15:
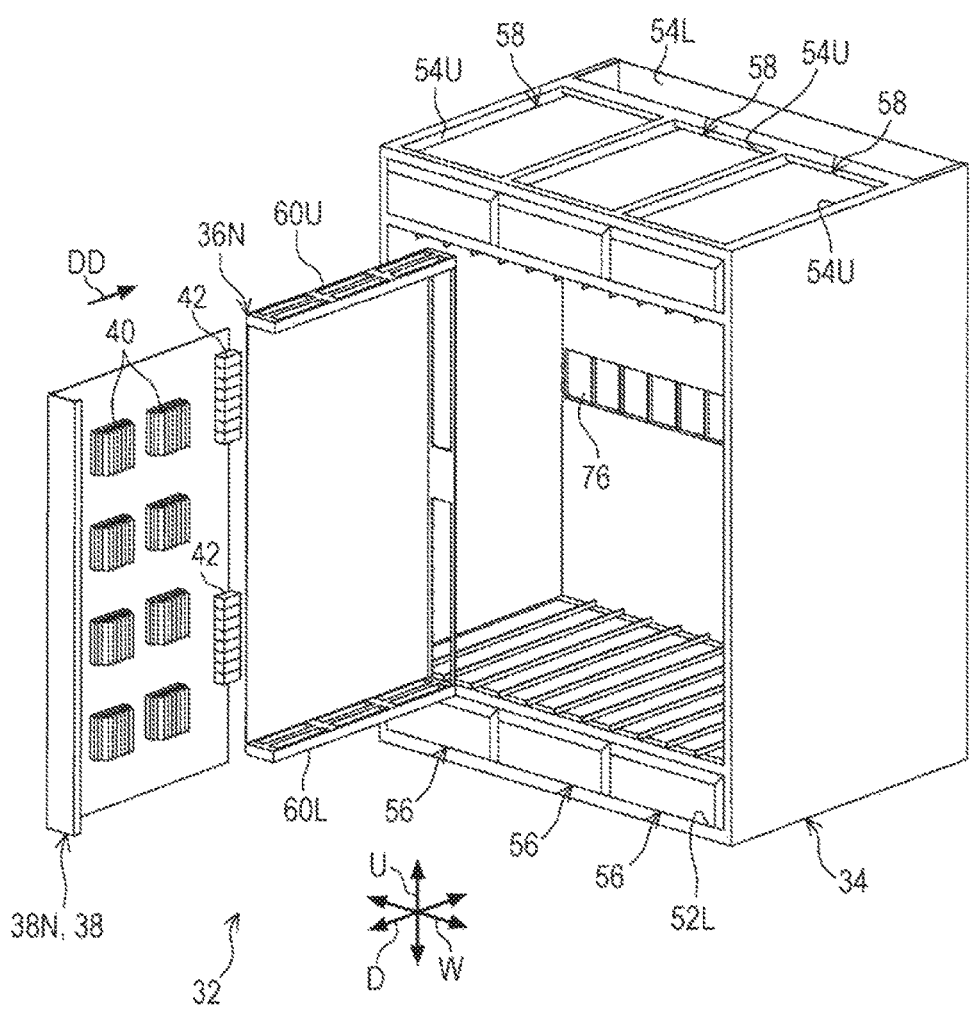
FIG. 15 is an exploded perspective view illustrating the electronic device of the first embodiment being partially not shown.

As illustrated in FIG. 15, there is a case in which a unit 38 (a large unit 38N) that is large (long in an arrow U direction) compared to the upper unit 38U and the lower unit 38L is mounted in the shelf 34 of the present embodiment. When mounting the unit 38N in the shelf 34, a frame 36N provided with no duct 48 and that corresponds to the unit 38N is used.

Figure 16:
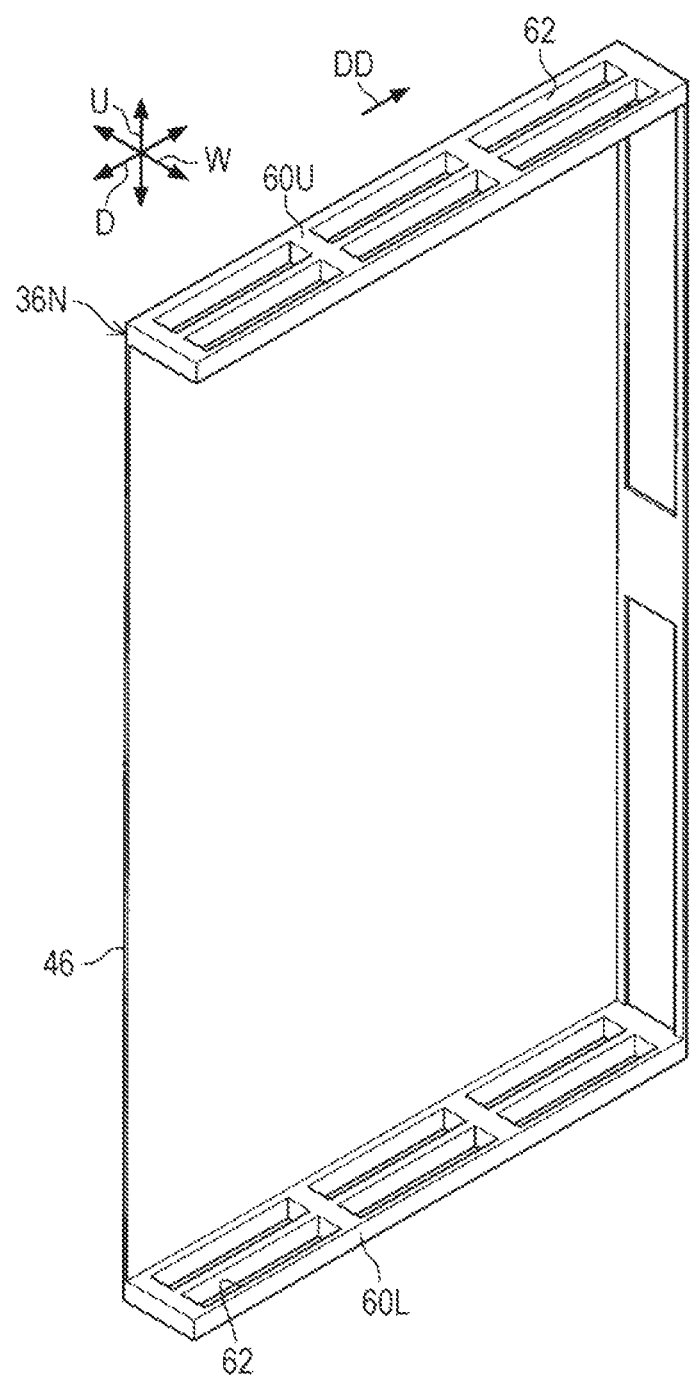
FIG. 16 is a perspective view illustrating the frame of the electronic device of the first embodiment.

As illustrated in FIG. 16, the frame 36N is a structure having no duct 48 (see FIGS. 3 to 4) and the unit 38N may be mounted therein.

Figure 17:
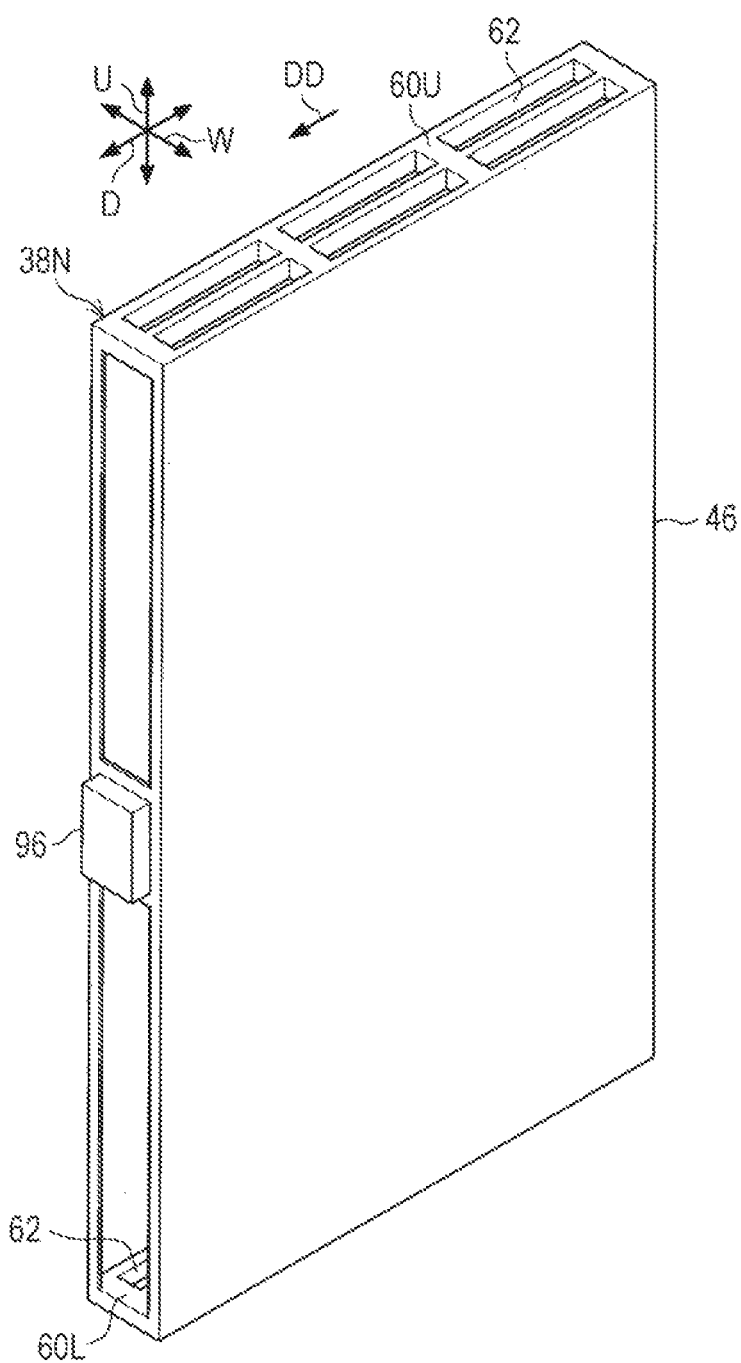
FIG. 17 is a perspective view illustrating the frame of the electronic device of the first embodiment.
Figure 18:
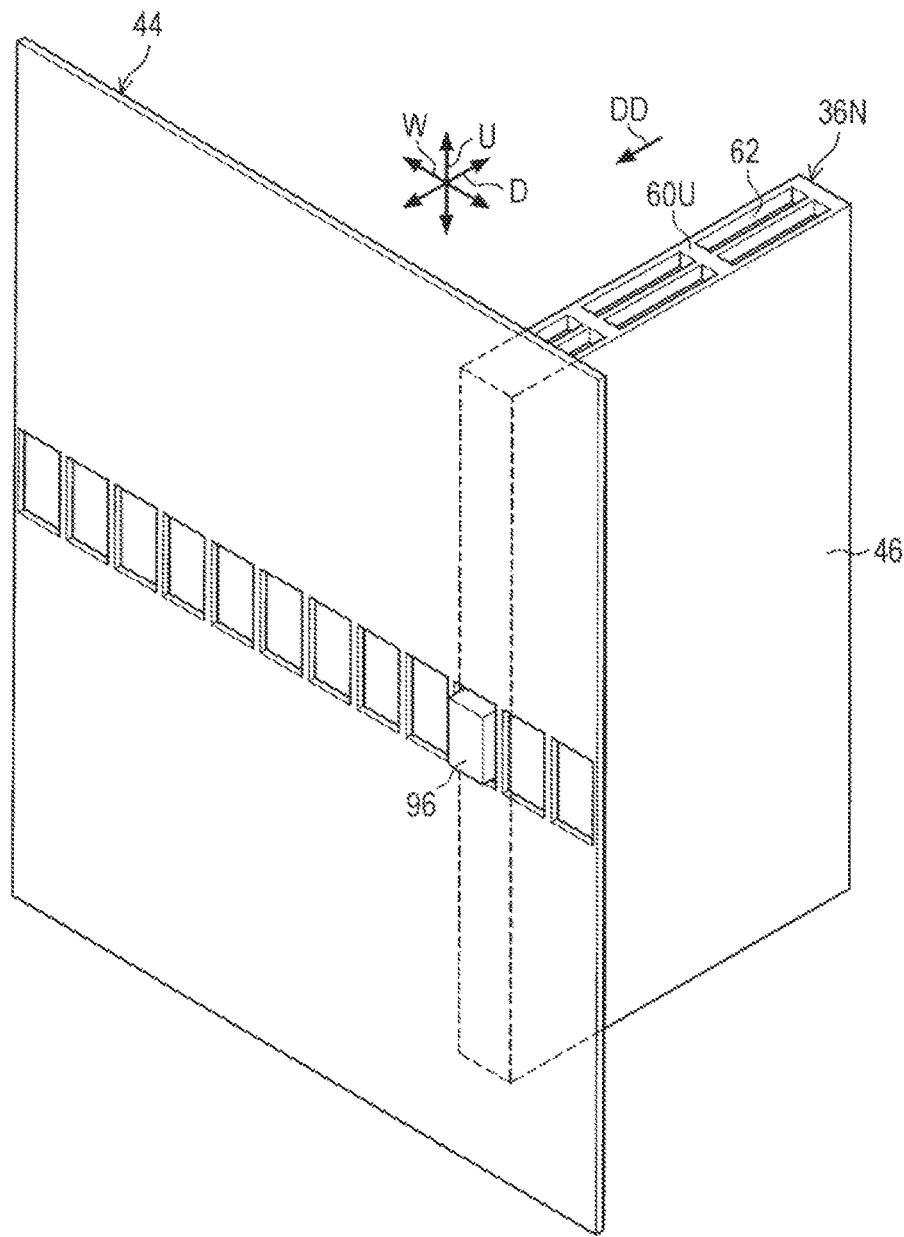
FIG. 18 is a perspective view illustrating the frame and the connection substrate of the electronic device of the first embodiment.

As illustrated in FIG. 17, a projection 96 is formed on the depth side of each frame 36N at the middle in the height direction. As illustrated in FIG. 18, in a state in which the frame 36N is disposed in the shelf 34, the projection 96 is provided at a position that closes the insertion hole 76 of the connection substrate 44.

On the surface of the connection substrate 44 on the front side, sealing materials 98 are disposed around the insertion holes 76. In a state in which the projection 96 closes the insertion hole 76, the sealing material 98 suppresses leakage of air between the frame 36N and the connection substrate 44.

A function of the present embodiment will be described next.

Figure 19:
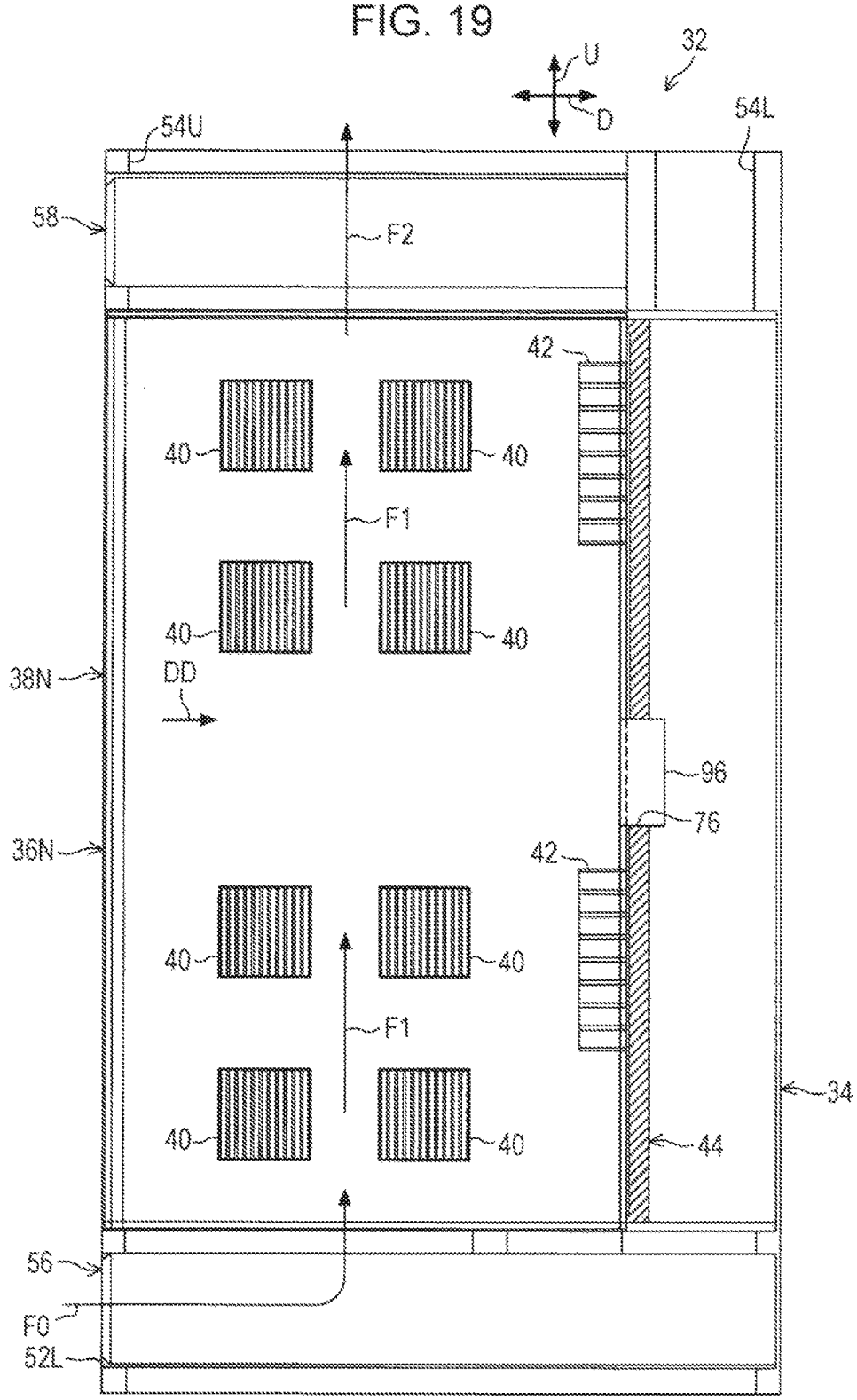
FIG. 19 is a cross-sectional view illustrating the electronic device of the first embodiment.

As illustrated in FIGS. 15 and 19, there is a case in which a large unit 38N is mounted in the shelf 34 using the frame 36N. In such a case, as indicated by an arrow F0 in FIG. 19, air may be drawn in from the intake port 52L with the drive of the suction fan 56 and the discharge fan 58. As indicated by an arrow F1, the air may cool the large unit 38N by ascending along the large unit 38N. The air that has cooled the large unit 38N is, as indicated by an arrow F2, discharged through the discharge port 54U.

As illustrated in FIGS. 18 and 19, since the insertion holes 76 of the connection substrate 44 is closed by the projections 96, a portion of the air ascending along the large unit 38N may be suppressed from leaking to the depth side of the connection substrate 44 through the insertion holes 76. Furthermore, with the sealing materials 98 (see FIG. 5), the air leaking from the gap between the frames 36 and the connection substrate 44 may be suppressed as well.

Since both the suction fan 56 and the discharge fan 58 may be driven, a large amount of air may be obtained when cooling the large unit 38N. However, when sufficient amount of air is obtained by either one of the suction fan 56 and the discharge fan 58, the either one of the fans may be driven only.

As illustrated in FIG. 13, in the shelf 34, there is a case in which there is a frame 36 (the lower mounted frame 36A) in which the lower unit 38L is mounted and a frame 36 (the lower non-mounted frame 36B) in which no lower unit 38L is mounted.

In the electronic device 32 of the present embodiment, as illustrated in FIG. 11, in a frame 36 (the lower non-mounted frame 36B) in which no lower unit 38L is mounted, the slide member 70 receiving the spring force (the tensile force) of the tension coil spring 86 is at the decreased position LS. As illustrated in FIGS. 8 and 9 in an enlarged manner, compared with a state in which the slide member 70 is at the increased position LD (see FIGS. 9 and 10), the cross-sectional area of the opening of the discharge port 54U is smaller.

The lower unit 38L may be mounted in the lower non-mounted frame 36B. As illustrated in FIG. 8, when the lower unit 38L is inserted into the lower mount portion 39L of the lower non-mounted frame 36B, in the course of the insertion, a portion of the lower unit 38L comes into contact with the push plate 82.

The spring force of the tension coil spring 86 acts on the lower unit 38L towards the front side through the slide member 70 and the push plates 82. When the lower unit 38L is further moved towards the depth side while countering the spring force, the slide member 70 slides and an increased position LD is reached.

In the above state, by operating the lock lever 88, the lower unit 38L becomes locked at the predetermined mount position in the shelf 34. The lower unit 38L being locked locks the slide member 70 at the increased position LD as well.

Note that when the lower unit 38L is drawn out towards the front side, the slide member 70 receiving the tensile force of the tension coil spring 86 slides towards the decreased position LS.

The frames 36 include ducts 48. Each duct 48, particularly the corresponding separator 68, separates the corresponding unit 38L (lower mount portion 39L) and the corresponding upper mount portion 39U from each other.

In the above state, as indicated by the arrow F3 in FIG. 10, with the drive of the discharge fan 58, the air is drawn in from the intake port 52U. As illustrated by an arrow F4, the air ascending along the upper unit 38U may cool the upper unit 38U. The air that has cooled the upper unit 38U is, as indicated by an arrow F5, discharged through the discharge port 54U. Furthermore, as indicated by the arrow F6, with the drive of the suction fan 56, air may be drawn in from the intake port 52L. As illustrated by the arrow F7, the air ascending along the lower unit 38L may cool the lower unit. The air that has cooled the lower unit 38L is, as indicated by the arrow F8, guided obliquely upwards towards the depth side with the separator 68. Furthermore, as indicated by the arrow F9, the air is guided towards the opening 78 with the inclined wall 72. The air that has passed through the opening 78 passes through between the connection substrate 44 and an inner wall of the shelf 34, and as indicated by the arrow F10, is discharged through the discharge port 54U.

As described above, by having the duct 48, particularly the separator 68, the air (the arrow F7) ascending along the lower unit 38L and the air (the arrow F4) ascending along the upper unit 38U are separated. Since the air that has increased its temperature by cooling the lower unit 38L does not come in contact with the upper unit 38U, the upper unit 38U may be effectively cooled with the air that has been drawn in from the intake port 52U.

Each separator 68 is inclined upwards from the front side towards the depth side. Accordingly, the air that has been drawn in from the intake port 52U is, as indicated by the arrow F3, guided obliquely upwards towards the depth side with the separator 68, in other words, is guided towards the upper unit 38U. Furthermore, the separator 68 may, as indicated by the arrow F8, guide the air that has ascended along the lower unit 38L obliquely upwards towards the depth side, in other words, towards the opening 78 side.

The inclined wall 72 of each slide member 70 is inclined upwards from the front side towards the depth side. Accordingly, the air that has been guided towards the depth side with the separator 68 is, as indicated by the arrow F9, guided further upwards, in other words, is guided towards the opening 78.

In the electronic device 132 of the comparative example illustrated in FIG. 12, the ventilation resistance of the lower mount portion 39L of the lower non-mounted frame 36B is small. Accordingly, a relatively large amount of air flows to the lower mount portion 39L of the lower non-mounted frame 36B. Furthermore, as a result of the above, the amount of air flowing in the lower mount portion 39L (the lower unit 38L) of the lower mounted frame 36A becomes relatively small.

Conversely, in the electronic device 32 of the present embodiment, as it may be understood from comparing between FIGS. 8 and 9, when the slide member 70 is at the decreased position LS, the cross-sectional area of the opening 78 is smaller than when at the increased position LD. Furthermore, the ventilation resistance (the portion passing through the lower mount portion 39L to the opening 78) of the lower non-mounted frame 36B is larger than that of the comparative example and is closer to the ventilation resistance of the lower mounted frame 36A.

Accordingly, as illustrated in FIG. 13, the amount of air flowing through the lower mount portion 39L of the lower non-mounted frame 36B may be made relatively small and the amount of air (cooling air) flowing through the lower mount portion 39L (the lower unit 38L) of the lower mounted frame 36A may be made relatively large accordingly.

Furthermore, with the above, the lower unit 38L of the lower mounted frame 36A may be cooled in an efficient manner. For example, the lower unit 38L of the lower mounted frame 36A may be cooled in an efficient manner without increasing the amount of air drawn in (the amount of air sent) by the suction fan 56.

As illustrated in FIG. 8, in the electronic device 32 of the present embodiment, the tension coil spring 86 biases the slide member 70 in a direction in which the protrusion length from the connection substrate 44 becomes shorter. Accordingly, in the lower non-mounted frame 36B, the slide member 70 may be reliably maintained at the decreased position LS, in other words, the slide member 70 may be reliably maintained in a state in which the opening area of the opening 78 is small.

Each tension coil spring 86 is fitted to the side wall 50S of the corresponding tubular body 50 that is a portion of the corresponding frame 36. A structure in which the tension coil springs 86 do not protrude out to the depth side of the connection substrate 44 may be made such that no effect will be exerted on the positions of the various members and wires in the depth side of the connection substrate 44.

As illustrated in FIGS. 1 and 2, in the electronic device 32, the units 38 include the lock levers 88. In particular, when the slide member 70 is pushed by the lower unit 38L and is at the increased position LD, by locking the lower unit 38L with the lock lever 88, the slide member 70 may be locked at the increased position LD.

The slide members 70 each include the corresponding inclined wall 72. Each inclined wall 72 inclines obliquely upwards towards the depth side from the corresponding duct 48 (tubular body 50). Accordingly, the flow of air towards each opening 78 may be guided upwards and may be discharged from the corresponding discharge port 54L in an efficient manner.

The electronic device 32 includes vertical walls 74 that are provided so as to stand on both sides of the inclined wall 72 of each slide member 70. With the vertical walls 74, the air that flows along the upper surface of each inclined wall 72 becoming spread in the width direction or a turbulent flow (vortex) being created may be suppressed and the air that flows through each opening 78 may be guided to the corresponding discharge port 54U.

In the electronic device 32 of the first embodiment, the vertical walls 74 are provided in each slide member 70. The vertical walls 74 have an integral structure with the corresponding inclined wall 72 and no gap is formed between the inclined wall 72 and the vertical walls 74. Accordingly, the gas that is guided along each inclined wall 72 may be effectively suppressed from being spread in the width direction and from having a turbulent flow be created therein.

Each frame 36 of the electronic device 32 includes the gasket 90. The gasket 90 comes into contact with the adjacent frame 36 and fills the gap between the frames 36. The gap between the lower mount portion 39L and the upper mount portion 39U is filled in the portion where the gasket 90 is present. As described above, by filling the gap between the lower mount portion 39L and the upper mount portion 39U, movement of gas between the upper mount portion 39U and the lower mount portion 39L is suppressed in a further reliable manner. For example, gas that has received heat of the lower unit 38L in the lower mount portion 39L may be suppressed from flowing into the upper mount portion 39U with the gasket 90.

An example in which each gasket 90 is provided on the lower portion of the side wall 50S of the corresponding tubular body 50 is given above. Each tubular body 50 is a portion that protrudes towards the adjacent frame 36 and at this position, the gap between the frames 36 is small.

Accordingly, when a gasket 90 is provided on each tubular body 50, the gap between the frames 36 may be filled with a small gasket.

Each gasket 90 has conductivity. Accordingly, leakage of electromagnetic waves generated in the lower unit 38L and the upper unit 38U may be suppressed.

Figure 20:
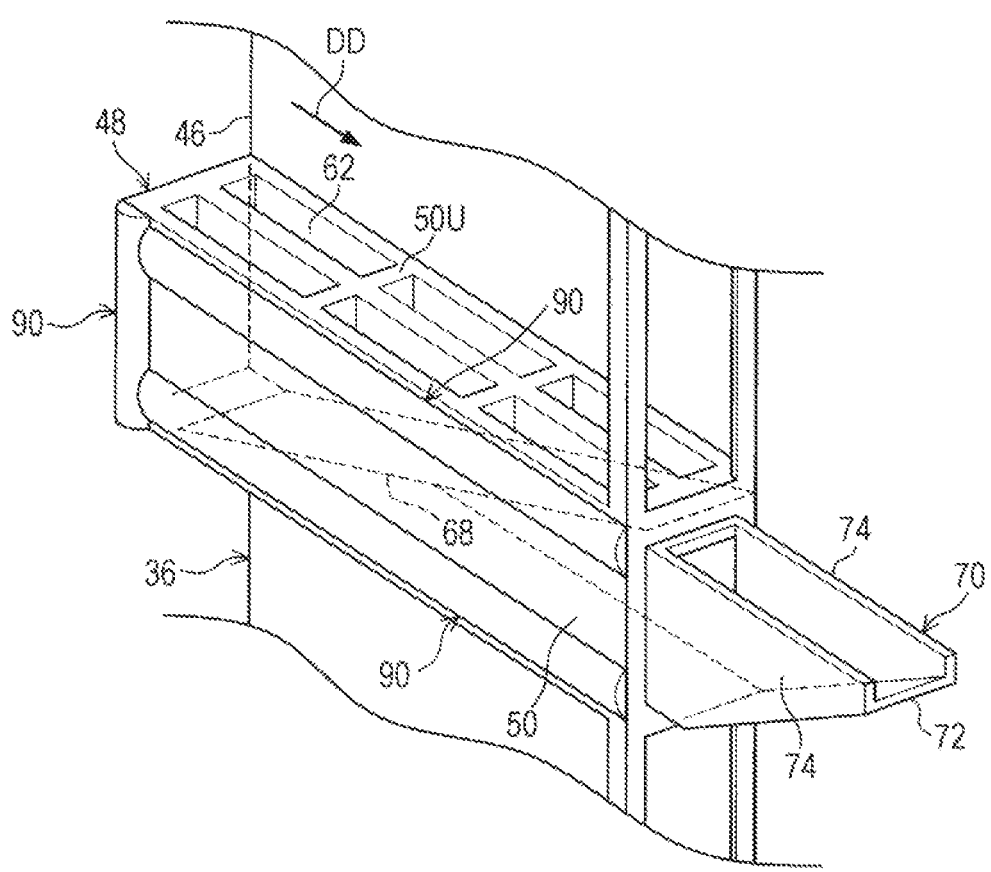
FIG. 20 is a perspective view illustrating a vicinity of a tubular body of an electronic device that is a modification of the first embodiment.

Note that the gasket 90 may have a structure as in a modification illustrated in FIG. 20. In the modification, the gasket 90 is not only provided on the lower portion of the side wall 50S of each tubular body 50 but is provided on the upper portion and the front side of each side wall 50S as well. By providing the gasket 90 on the upper portion of the side wall 50S of each tubular body 50, the movement of gas between the upper mount portion 39U and the lower mount portion 39L may be suppressed in a further reliable manner. By providing the gasket 90 in the front side of the side wall 50S of each tubular body 50, leakage of electromagnetic waves from the lower units 38L and the upper units 38U may be suppressed in a further reliable manner.

The intake ports 52U of the tubular bodies 50 of the frames 36 are covered with ventilation plates 64 that includes vent holes 66. Since the ventilation plates 64 have conductivity, leakage of the electromagnetic waves generated in the upper units 38U from the intake ports 52U may be suppressed.

Since vent holes 66 are formed in the ventilation plates 64, suction of air form the intake ports 52U is possible.

Second Embodiment

A description of a second embodiment will be given next. In the second embodiment, elements and components that are similar to those of the first embodiment are denoted with the same reference numerals and detailed descriptions thereof are omitted. The overall structure of an electronic device of the second embodiment may have a similar structure to that of the electronic device 32 of the first embodiment and, accordingly, illustration thereof is omitted.

Figure 21:
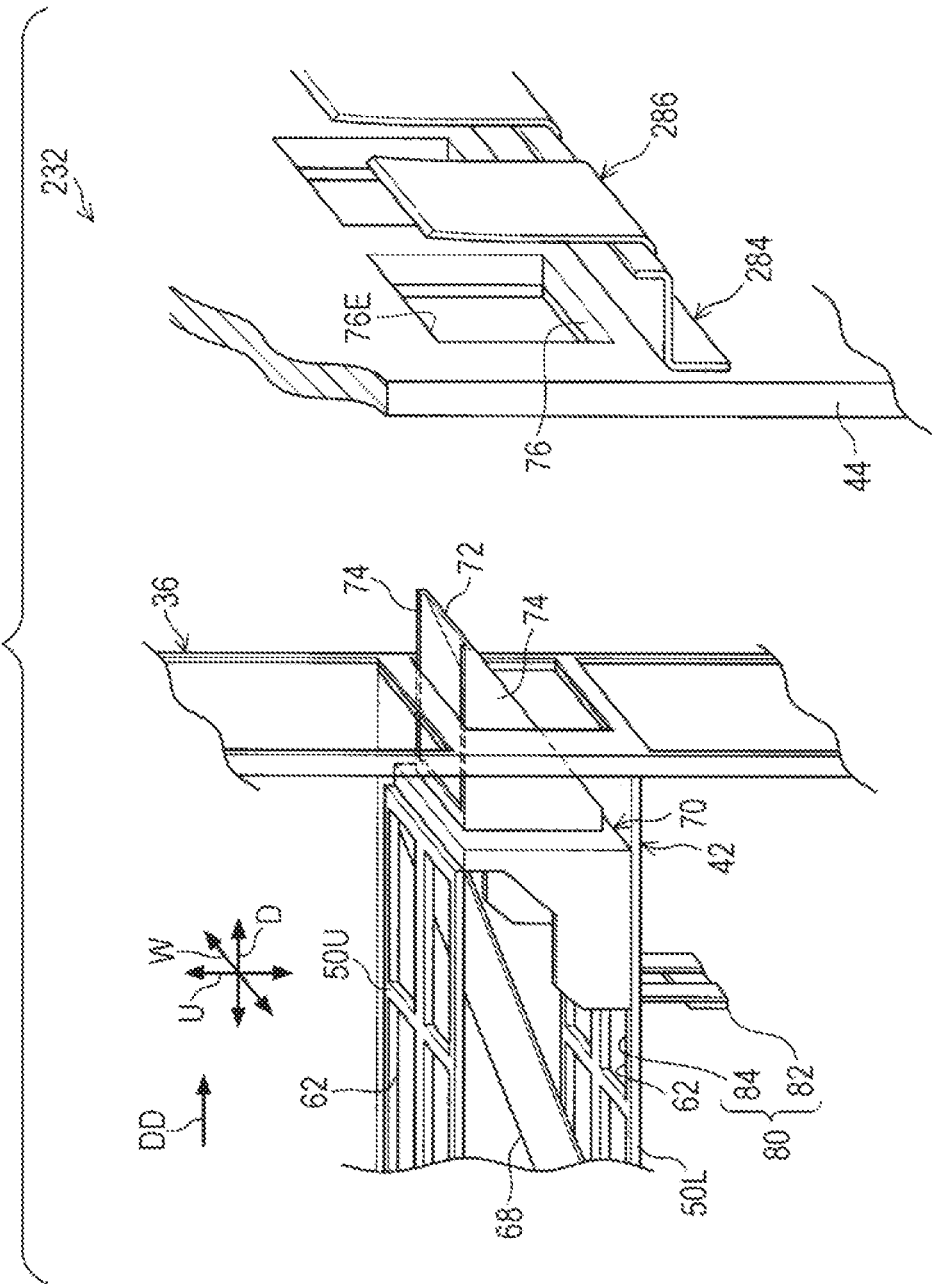
FIG. 21 is a perspective view illustrating a vicinity of a slide member of an electronic device of a second embodiment.

As illustrated in FIG. 21, in an electronic device 232 of the second embodiment, flat springs 286 are fixed on the depth side of the connection substrate 44 through brackets 284.

Figure 22:
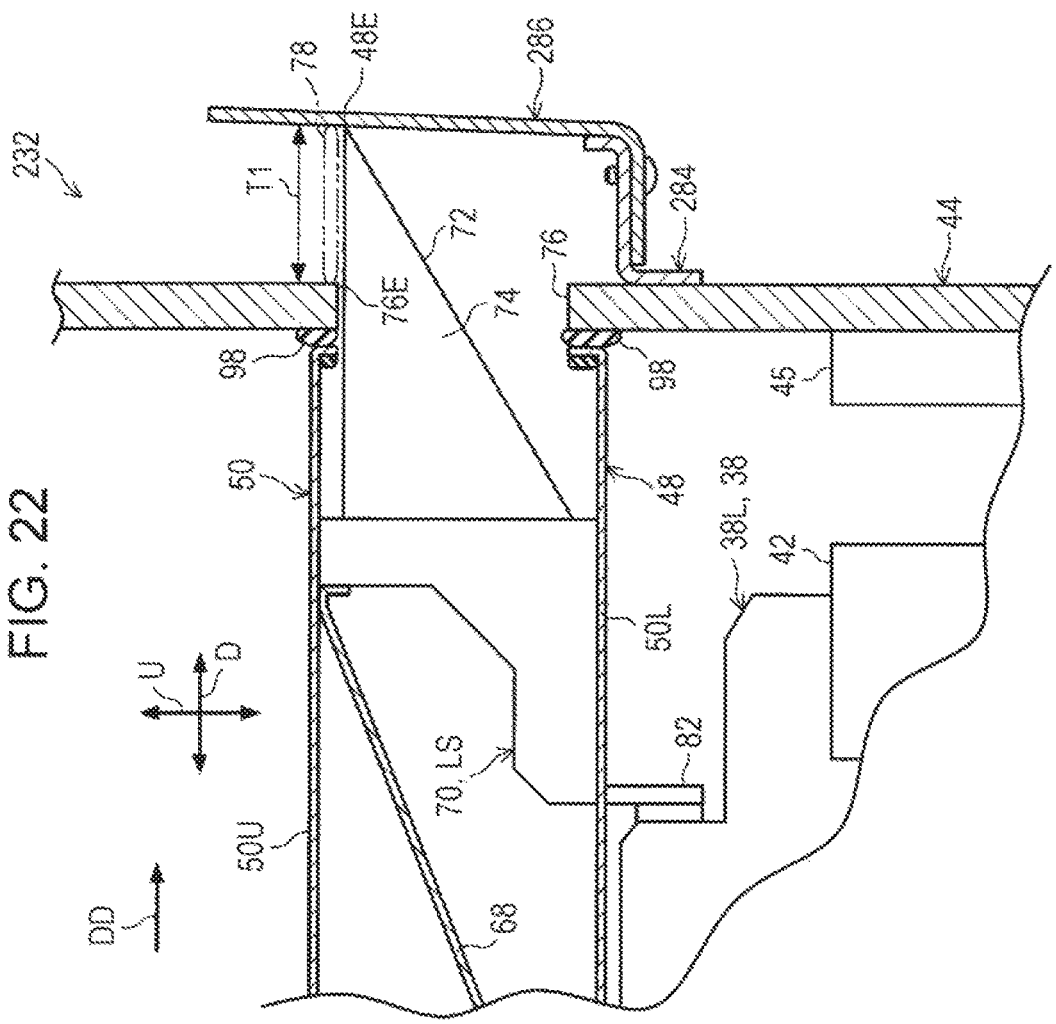
FIG. 22 is a cross-sectional view illustrating a vicinity of the slide member of the electronic device of the second embodiment.
Figure 23:
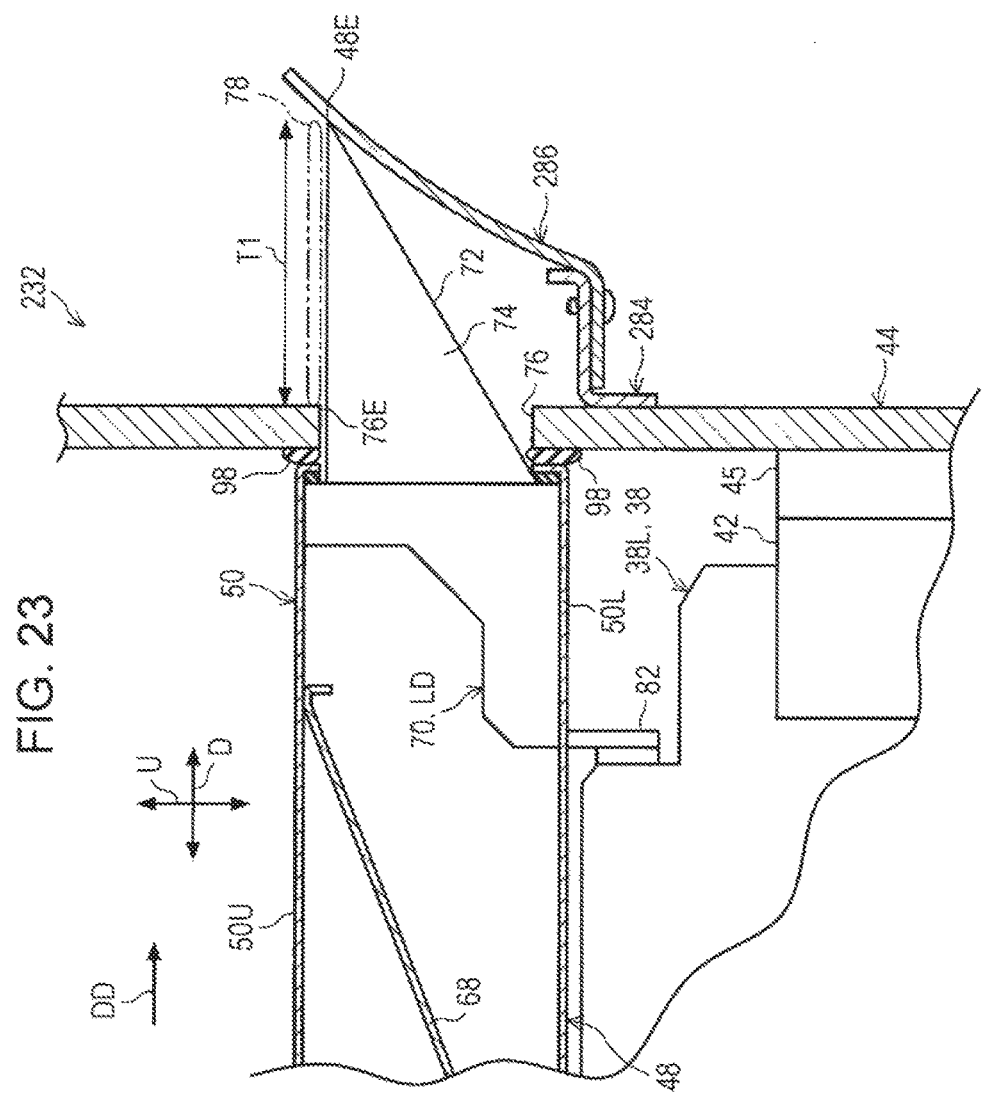
FIG. 23 is a cross-sectional view illustrating a vicinity of the slide member of the electronic device of the second embodiment.

As illustrated in FIGS. 22 and 23, the flat springs 286 comes in contact with the slide members 70 from the depth side. Furthermore, the flat springs 286 each push the corresponding slide member 70 towards the decreased position LS with its spring force. The flat spring 286 is an example of a push spring.

Note that in the electronic device 232 of the second embodiment, the tension coil springs 86 (see FIGS. 7 to 9, for example) of the first embodiment are provided.

As illustrated in FIG. 22, in the second embodiment, in the lower non-mounted frame 36B having no lower unit 38L mounted thereon (including a state in which the lower unit 38L is not pushed to the mount position), the slide member 70 is pushed by the flat spring 286 and the decreased position LS is maintained.

Then, as illustrated in FIG. 23, when the lower unit 38L is mounted in the lower mount portion 39L, being pushed by the lower unit 38L, the slide member 70 moves to the increased position LD while countering the spring force of the flat spring 286.

The flat springs 286 of the second embodiment are fitted to the connection substrate 44. Accordingly, the flat springs 286 exert no effect on the shapes and mounting positions of the members (the units 38, other electronic components, and the like) that are mounted on the frames 36.

Third Embodiment

A description of a third embodiment will be given next. In the third embodiment, elements and components that are similar to those of the first embodiment are denoted with the same reference numerals and detailed descriptions thereof are omitted. The overall structure of an electronic device of the third embodiment may have a similar structure to that of the electronic device 32 of the first embodiment and, accordingly, illustration thereof is omitted.

Figure 24:
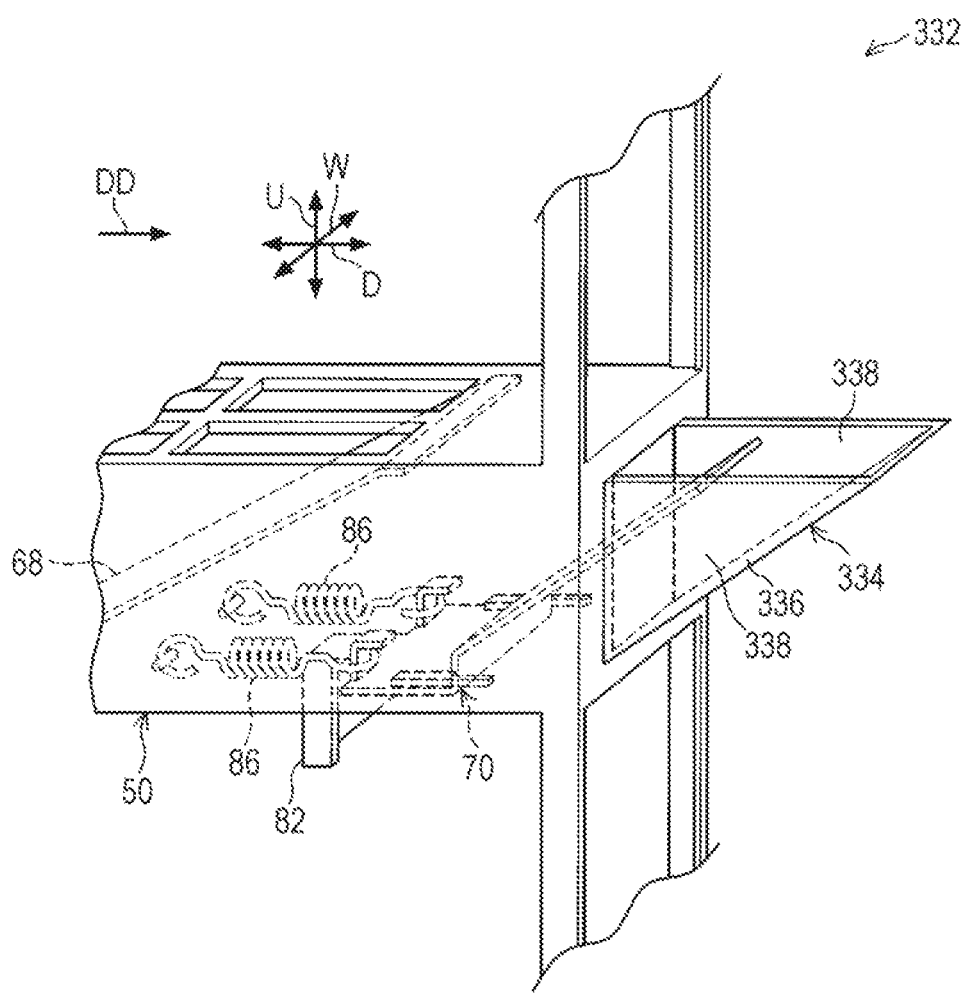
FIG. 24 is a perspective view illustrating a vicinity of a slide member of an electronic device of a third embodiment.
Figure 25:
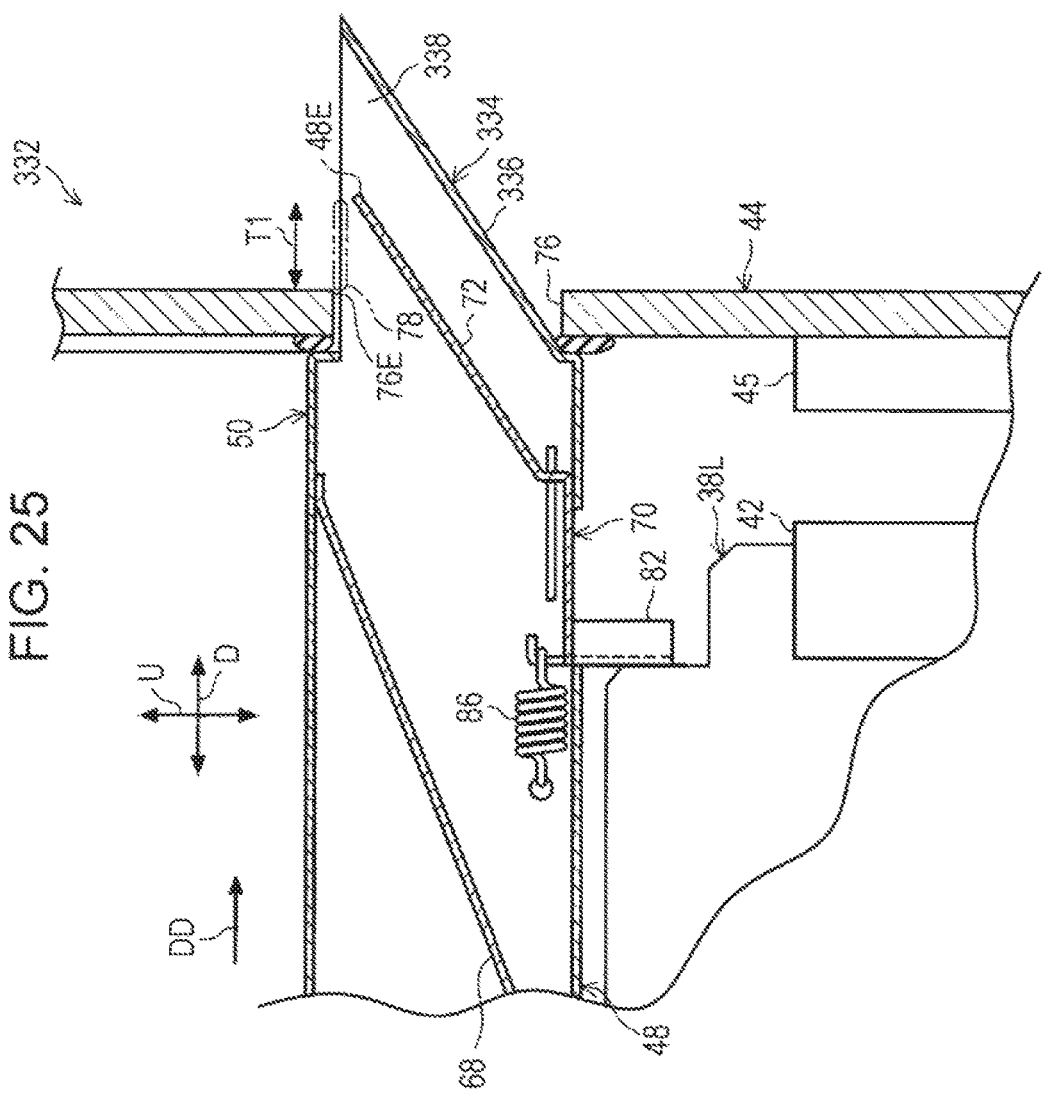
FIG. 25 is a cross-sectional view illustrating a vicinity of the slide member of the electronic device of the third embodiment.
Figure 26:
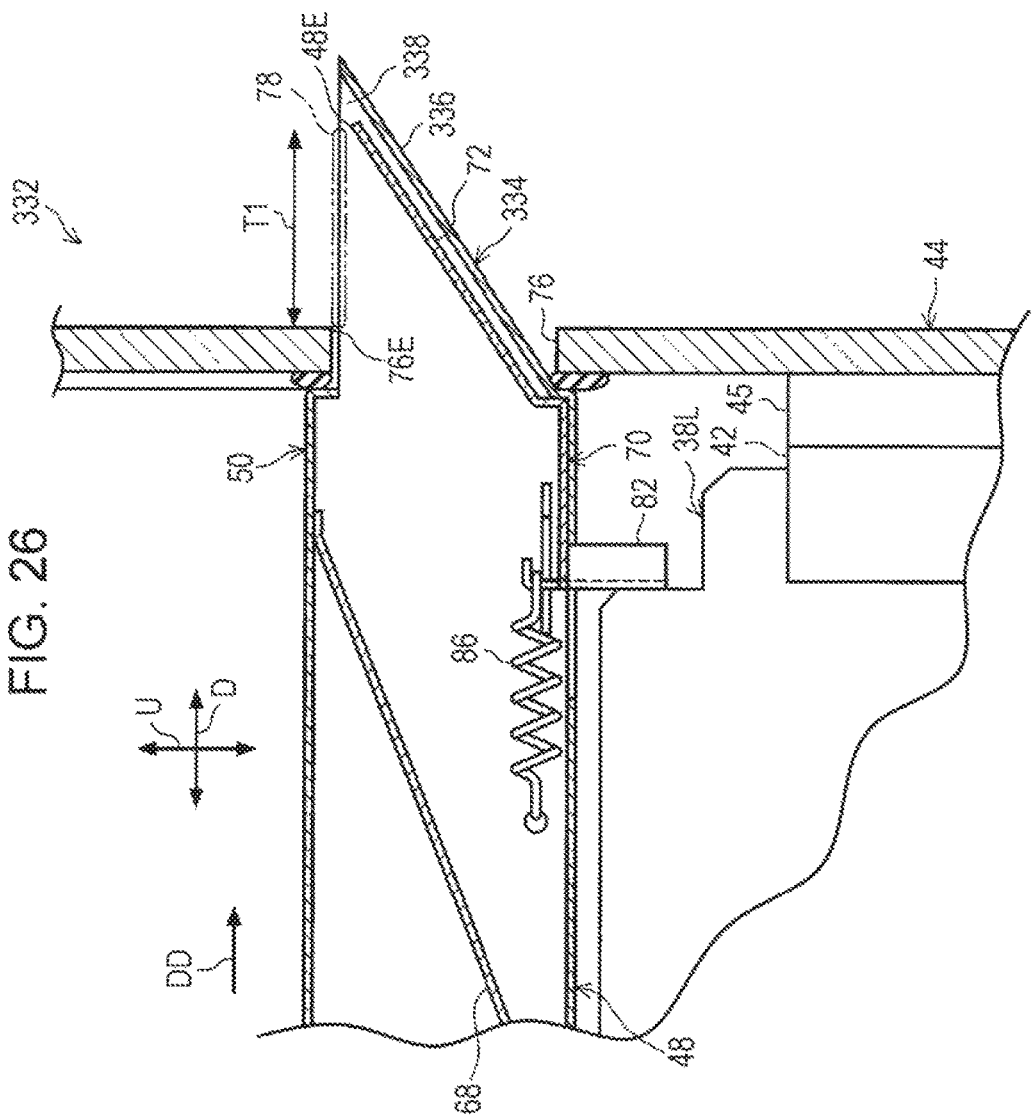
FIG. 26 is a cross-sectional view illustrating a vicinity of the slide member of the electronic device of the third embodiment.
Figure 27:
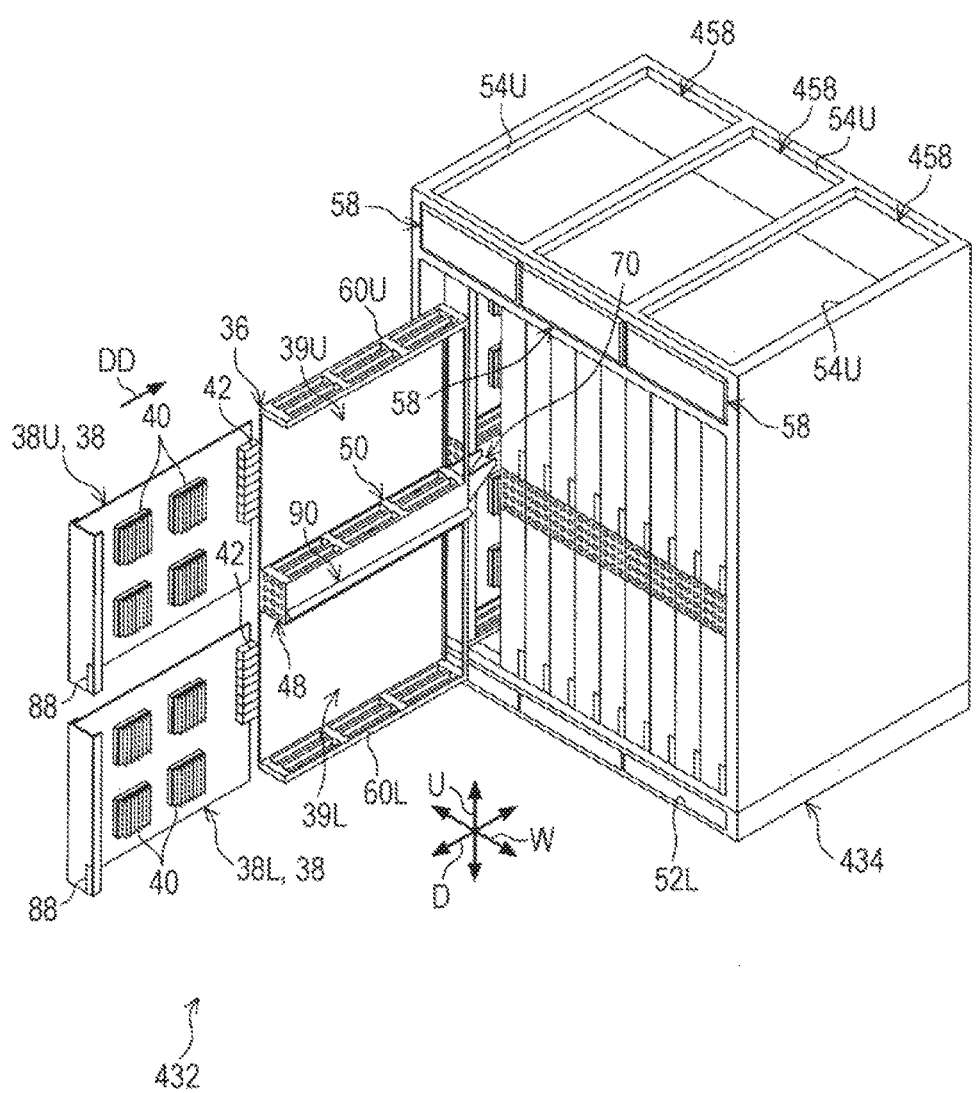
FIG. 27 is an exploded perspective view illustrating an electronic device of a fourth embodiment.
Figure 28:
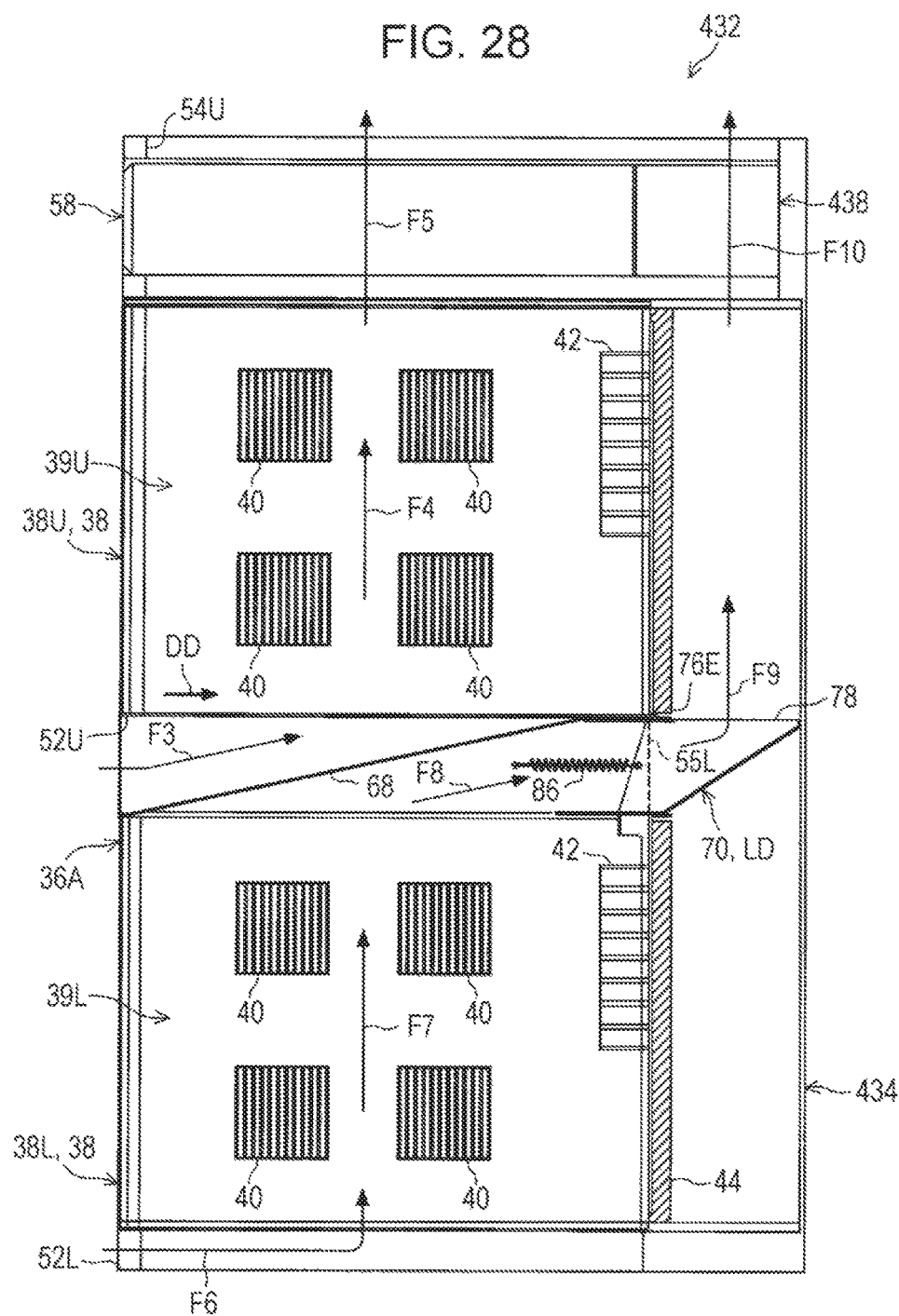
FIG. 28 is a cross-sectional view illustrating the electronic device of the fourth embodiment.
Figure 29:
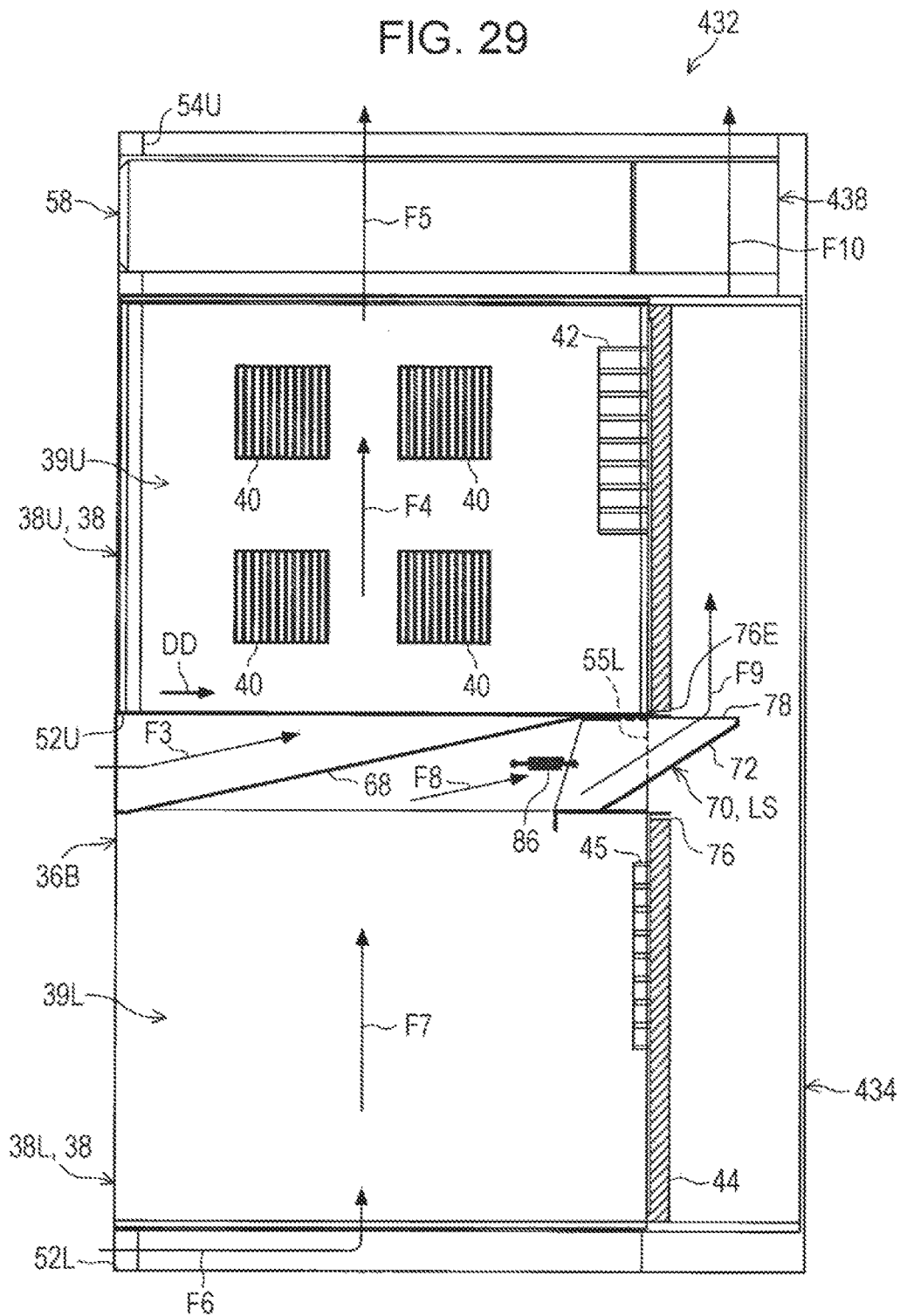
FIG. 29 is a cross-sectional view illustrating the electronic device of the fourth embodiment.
Figure 30:
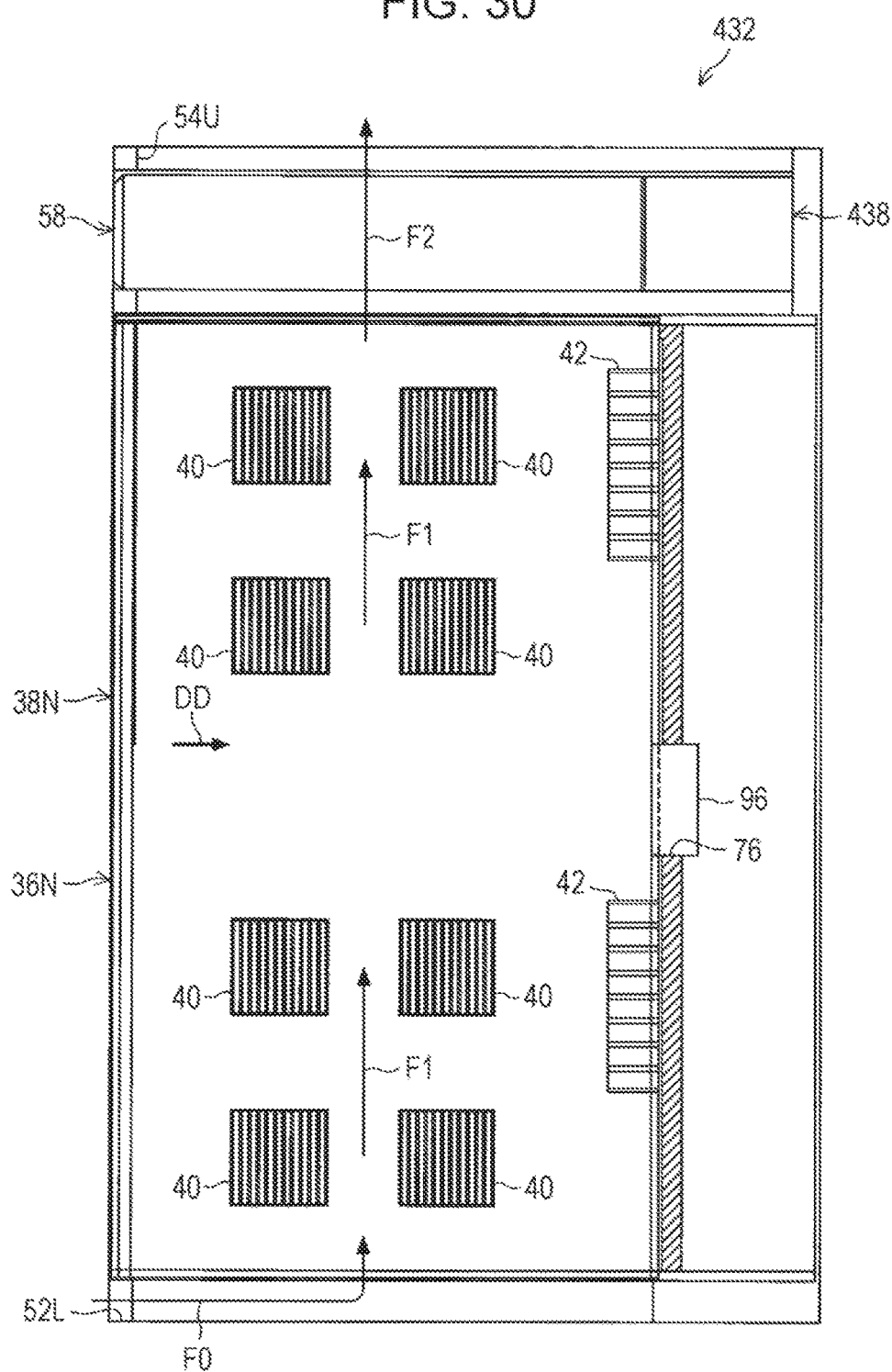
FIG. 30 is a cross-sectional view illustrating the electronic device of the fourth embodiment.

As illustrated in FIG. 24, in an electronic device 332 of the third embodiment, outer frames 334 are fitted on the depth side of the tubular bodies 50 (the separation members). As illustrated in FIGS. 25 and 26, the outer frames 334 each include an inclined wall 336 that is parallel to the inclined wall 72 of the slide member 70, and vertical walls 338 that are provided so as to stand on both sides of the inclined walls 336.

A portion of each outer frame 334 on the depth side is inserted into the corresponding insertion holes 76 of the connection substrate 44, and is positioned on the depth side of the connection substrate 44.

In the third embodiment of the electronic device 332, as described above, the vertical walls 338 are fixed to the tubular body 50. Since the vertical walls 338 are not provided in the slide member 70, the slide member 70 may be reduced in weight and contribution to smooth sliding of the slide member 70 may be made.

Note that in the third embodiment, as illustrated in FIG. 24, a plurality of (two) tension coil springs 86 are disposed so as to be arranged in the width direction. With the above, tensile force to the slide member 70 towards the decreased position LS may be applied in a stable manner.

Fourth Embodiment

A description of a fourth embodiment will be given next. In the fourth embodiment, elements and components that are similar to those of the first embodiment are denoted with the same reference numerals and detailed descriptions thereof are omitted.

As illustrated in FIGS. 27 to 30, in the electronic device 432 of the fourth embodiment, discharge fans 458 are provided in a portion in the upper portion of a shelf 434 and on the depth side of the discharge fans 58. As indicated by the arrow F6, with the drive of the discharge fans 458, air may be drawn in from the intake port 52L. Furthermore, the air that has been drawn in from the intake ports 52L is, as indicated by the arrow F7, ascended in the lower mount portions 39L and, further, as indicated in the order of arrows F8 to F10, passes through the openings 78, and is discharged through the discharge ports 54U.

In the electronic device 432 of the fourth embodiment, since no suction fan 56 (see FIG. 1) is provided in the lower portion of the shelf 434, the height of the shelf 434 may be made low.

Note that in the electronic device 432 of the fourth embodiment, when the frame 36N corresponding to the large unit 38N is used, the air is drawn in from the intake port 52U and ascends along the large unit 38N. In such a case, the discharge fan 436 on the depth side may be stopped.

In each of the embodiments described above, each duct 48 includes the separator 68 and the slide member 70. In other words, the member that separates the lower unit 38L (the lower mount portion 39L) and the upper unit 38U (the upper mount portion 39U) from each other, and the member that forms an opening 78 between the hole edge of the insertion hole 76 are separate members. Accordingly, a structure that exerts the above functions, with separate members, in a further effective manner may be obtained.

The slide member 70 may have a structure in which the increased position LD and the decreased position LS are moved by directly performing a manual operation. In the embodiments described above, the protrusion length becomes longer (moves to the increased position LD) by being pushed by the lower unit 38L mounted in the frame 36. In other words, with the operation of mounting the lower unit 38L in the frame 36, the slide member 70 may be moved to the increased position LD at the same time, and no manual operation is to be directly performed on the slide member 70.

Each slide member 70 includes the push plates 82 (an example of a push member). Even if the lower unit 38L and the slide member 70 are spaced far apart in the up-down direction, by having the lower unit 38L push the push plates 82, the slide member 70 may be reliably pushed.

The sliding of the slide member 70 is guided by the guide member 80. Compared to a structure with no guide member 80, the slide member 70 is slid in a smoother manner in the width direction.

The guide member 80 includes push plates 82 and long holes 84. In other words, the sliding of the slide member 70 may be guided with a simple structure, that is, with the push plates 82 that protrude from the slide member 70 and the long holes 84 that are formed in the tubular body 50.

In particular, the push plates 82 also serve as the projection of the guide member 80. In other words, the projection of the guide member 80 is positioned at where the projection is pushed by the lower unit mounted in the frame 36. Compared with a structure in which the push plate 82 (push member) and the projection of the guide member 80 are separate members, the number of parts is fewer.

In the above description, an exemplification of an electronic device including suction fans and discharge fans have been given; however, the structure may be such that flow of air is generated with a suction fan and a discharge fan that are separate with respect to the electronic device and the flow of air is introduced into the electronic device.

The structure of the electronic device is not limited to a structure in which the sliding of the slide member 70 is interlocked with the operation of mounting the lower unit 38L in the shelf 34. For example, in a state in which the lower unit 38L is mounted, the slide member 70 may be slid to the increased position LD by performing manual operation on the slide member 70 in a direct manner.

The structure of increasing the opening surface of the opening 78 is not limited to the slide of the slide member 70 and, in short, it is only sufficient that the protrusion length of the duct 48 is allowed to become long with respect to the insertion hole 76. For example, in place of the slide member 70, a pivoting member that increases the opening area of the opening 78 by pivoting may be provided in the connection substrate 44.

Now, a description has been given of the embodiments of the technique disclosed in the present application; however, the technique disclosed in the present application is not limited to the above and it goes without saying that various modifications may be made without departing from the spirit and scope of the disclosure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device, comprising:
   a frame in which a first unit is mountable on an upper row of the frame and a second unit is mountable on a lower row of the frame;
   a rack configured to accommodate the frame;
   a back plate configured to close the rack; and
   a duct configured to, while the first unit is mounted on the upper row and the second unit is mounted on the lower row,
      separate the first unit and the second unit from each other,
      protrude from an insertion hole formed in the back plate, and
      form an opening with a hole edge of the insertion hole, so as to discharge, through the opening, air passing through the second unit,
   wherein the duct is configured so that a protrusion length of the duct from the insertion hole is adjustable to thereby adjust a cross-sectional area of the opening.

2. The electronic device according to claim 1, wherein the duct includes
   a separation member configured to, while the first unit is mounted on the upper row and the second unit is mounted on the lower row, separate the first unit and the second unit from each other, and
   a slide member configured to protrude from the insertion hole, and to slide with respect to the separation member to thereby adjust the protrusion length.

3. The electronic device according to claim 2,
   wherein, as the second unit is being mounted on the lower row, the slide member is configured to be pushed by the second unit to thereby increase the protrusion length.

4. The electronic device according to claim 3,
   wherein the slide member includes a push member configured to, as the second unit is being mounted on the lower row, be pushed by the second unit and thereby move in a direction in which the protrusion length increases.

5. The electronic device according to claim 3,
   wherein the duct includes a spring configured to bias the slide member in a direction in which the protrusion length from the back plate becomes shorter,
   wherein each respective unit of the first unit and the second unit includes a lock member configured to lock the respective unit, while in a state in which the protrusion length of the slide member from the back plate is long.

6. The electronic device according to claim 5,
   wherein the spring is a tension spring to pull the slide member, the spring being fixed to the frame or the separation member.

7. The electronic device according to claim 5,
   wherein the spring is a push spring to push the slide member, the spring being fixed to the back plate.

8. The electronic device according to claim 2,
wherein the slide member includes a guide member to guide a slide of the slide member.

9. The electronic device according to claim 8,
wherein the guide member includes
a projection portion protruding from the slide member, and
a guide plate configured to form a long hole extending in a slide direction, the guide plate accommodating the projection portion.

10. The electronic device according to claim 9,
wherein the projection portion is positioned so that, as the second unit is being mounted on the lower row, the projection portion is pushed by the second unit.

11. The electronic device according to claim 2,
wherein the slide member includes an inclined wall inclined obliquely upwards.

12. The electronic device according to claim 11,
wherein the slide member includes vertical walls provided on each of two sides of the inclined wall in an erect manner.

13. The electronic device according to claim 12,
wherein the vertical walls are provided in the separation member.

14. The electronic device according to claim 1, further comprising:
a gasket configured to fill a gap between frames adjacent sideways to each other.

15. The electronic device according to claim 14,
wherein the gasket has conductivity.

16. The electronic device according to claim 2,
wherein the duct further includes a ventilation plate configured to have a vent hole and cover an intake port of the frame, the ventilation plate having conductivity.

17. A method for use with an electronic device that includes
a frame having an upper row on which a first unit is mountable, and a lower row on which a second unit is mountable,
a rack configured to accommodate the frame,
a back plate configured to close the rack, and
a duct configured to, while the first unit is mounted on the upper row and the second unit is mounted on the lower row, separate the first unit and the second unit, and protrude from an insertion hole formed in the back plate and thereby form an opening with a hole edge of the insertion hole, the method comprising:
pushing the duct by pushing the second unit on to the lower row to mount the second unit on the lower row, thereby extending a protrusion length of the duct from the insertion hole and thereby increasing a cross-sectional area of the opening, and
discharging, through the opening having the increased cross-sectional area, air passed through the second unit mounted on the lower row.

18. The method according to claim 17,
wherein the duct includes
a separation member configured to, while the first unit is mounted on the upper row and the second unit is mounted on the lower row, separate the first unit and the second unit from each other, and
a slide member configured to slide with respect to the separation member, and protrude from the insertion hole,
wherein the pushing the second unit causes the slide member to slide and thereby adjust the protrusion length.

19. The method according to claim 18,
wherein the duct includes a spring configured to bias the slide member in a direction in which a protrusion length from the back plate becomes shorter, and
wherein the sliding of the slide member counters a spring force of the spring.

* * * * *